(12) United States Patent
Tenneti

(10) Patent No.: US 9,407,171 B2
(45) Date of Patent: Aug. 2, 2016

(54) APPARATUS AND A METHOD FOR ENHANCING POWER OUTPUT IN ELECTRICAL CIRCUITS

(75) Inventor: Sabreesh Tenneti, Muscat (OM)

(73) Assignee: Dytech Energy Pte. Ltd., Singapore (SG)

(*) Notice: Subject to any disclaimer, the term of this patent is extended or adjusted under 35 U.S.C. 154(b) by 0 days.

(21) Appl. No.: 14/376,022

(22) PCT Filed: Sep. 3, 2012

(86) PCT No.: PCT/SG2012/000314
§ 371 (c)(1),
(2), (4) Date: Jul. 31, 2014

(87) PCT Pub. No.: WO2014/035337
PCT Pub. Date: Mar. 6, 2014

(65) Prior Publication Data
US 2014/0355317 A1    Dec. 4, 2014

(51) Int. Cl.
*H02M 3/137* (2006.01)
*H02M 7/5395* (2006.01)
*H02M 1/08* (2006.01)
*H02M 1/06* (2006.01)
*H02M 3/00* (2006.01)
*H03K 17/725* (2006.01)

(52) U.S. Cl.
CPC .............. *H02M 7/5395* (2013.01); *H02M 1/06* (2013.01); *H02M 1/08* (2013.01); *H02M 3/00* (2013.01); *H02M 3/137* (2013.01); *H03K 17/725* (2013.01)

(58) Field of Classification Search
CPC ....... H02M 1/06; H02M 1/08; H02M 7/5395; H02M 3/137; H02M 3/00; H03K 17/725
USPC ........ 363/27, 37, 96, 135; 323/265, 271, 282, 323/284, 289
See application file for complete search history.

(56) References Cited

U.S. PATENT DOCUMENTS 4,107,551 A * 8/1978 Akamatsu .......... H03K 17/0403
                                                    327/440
4,130,767 A * 12/1978 Okuhara .............. H03K 17/725
                                                    327/462

(Continued)

FOREIGN PATENT DOCUMENTS

JP    57145572    9/1982
JP    59172969    9/1984

(Continued)

OTHER PUBLICATIONS

International Search Report for International Application No. PCT/SG2012/000314, mailed May 24, 2013, 3 pages.

(Continued)

*Primary Examiner* — Fred E Finch, III
*Assistant Examiner* — Gustavo Rosario Benitez
(74) *Attorney, Agent, or Firm* — GrayRobinson, PA

(57) ABSTRACT

A controller connected to the gate, cathode and anode of a thyristor, may be configured such that in response to the anode being provided with a voltage, the controller activates the thyristor to allow current flow between the anode and the gate in a first instance and to allow current flow between the gate and the cathode in a second instance so as to provide the cathode with an enhanced voltage, the enhanced voltage being an enhancement of the voltage at the anode.

44 Claims, 14 Drawing Sheets

(56) References Cited

U.S. PATENT DOCUMENTS

| | | | | |
|---|---|---|---|---|
| 5,703,474 | A | * | 12/1997 | Smalser ........................ 323/299 |
| 5,883,500 | A | * | 3/1999 | Pezzani ................ H03K 17/725 <br> 318/280 |
| 6,323,718 | B1 | * | 11/2001 | Rault .................. H01L 27/0641 <br> 257/E27.018 |
| 2002/0063116 | A1 | * | 5/2002 | Ikeda et al. .............. 219/130.21 |
| 2002/0118503 | A1 | * | 8/2002 | Gruening ................ H02M 1/08 <br> 361/100 |
| 2012/0113683 | A1 | * | 5/2012 | Perisic et al. ................... 363/17 |

FOREIGN PATENT DOCUMENTS

| | | |
|---|---|---|
| JP | 02288727 | 11/1990 |
| JP | 03205915 | 9/1991 |

OTHER PUBLICATIONS

Written Opinion for International Application No. PCT/SG2012/000314, mailed May 24, 2013, 3 pages.

* cited by examiner

US 9,407,171 B2

APPARATUS AND A METHOD FOR ENHANCING POWER OUTPUT IN ELECTRICAL CIRCUITS

CROSS-REFERENCE TO RELATED APPLICATION

This application is the U.S. national stage of International (PCT) Patent Application No. PCT/SG2012/000314, which was filed on Sep. 3, 2012, and the contents of which are hereby incorporated herein by reference in their entirety.

FIELD OF THE INVENTION

The present invention relates to an apparatus and a method for enhancing power output, for example, during Direct Current (DC) to Alternating Current (AC) conversion.

BACKGROUND

Certain types of distributed power generators supplying DC power provide unstable voltages. An example would be a power generator dependent on solar power. Hence, in the design of the circuitries to convert the DC power supplied by such power generators into AC power, one would have to take into account the unstable voltages.

DC to AC converter circuits typically include controller components, such as a pulse width modulation (PWM) based controller, power electronic switches and capacitors. Various DC to AC converter circuit configurations may also include full-bridge or half-bridge inverters. The use of such electronic components can help to compensate for the unstable voltages supplied by the power generator.

However, current DC to AC inverter circuits have a few drawbacks. For instance, DC to AC inverter circuits used for power generators relying on solar panels have high power transmission losses in the connecting lines between the panels. External power sources may also be required to operate certain components of the DC to AC inverter circuits. The DC to AC inverter circuits are also bulky in size and may include big transformer windings with high heat losses. In addition, power electronic switches used in current DC to AC inverter circuits have switching losses and they could be exacerbated by poor design of the DC to AC inverter circuits, which is the case for some existing designs of DC to AC inverter circuits. Moreover, the DC to AC inverter circuits would not work without auxiliary power source from a battery or grid power if voltage from the power source, e.g. solar panels is not constant.

In addition, current technology used in On-Grid Photovoltaic systems has inherent problems in residential and commercial usage. For instance, the absence of safety features poses risks to both workers installing or maintaining the system, and to fire-fighters dealing with fires in the vicinity of photovoltaic installations.

Therefore, it is important to design a well-calibrated DC to AC inverter for power generators supplying DC power to reduce amongst other things overall heat losses, transmission losses, switching losses and conversion losses.

BRIEF DESCRIPTION OF THE DRAWINGS

Various embodiments of the invention will now be described, by way of example only, and with reference to the accompanying drawings in which.

SUMMARY OF THE INVENTION

Figure 1:
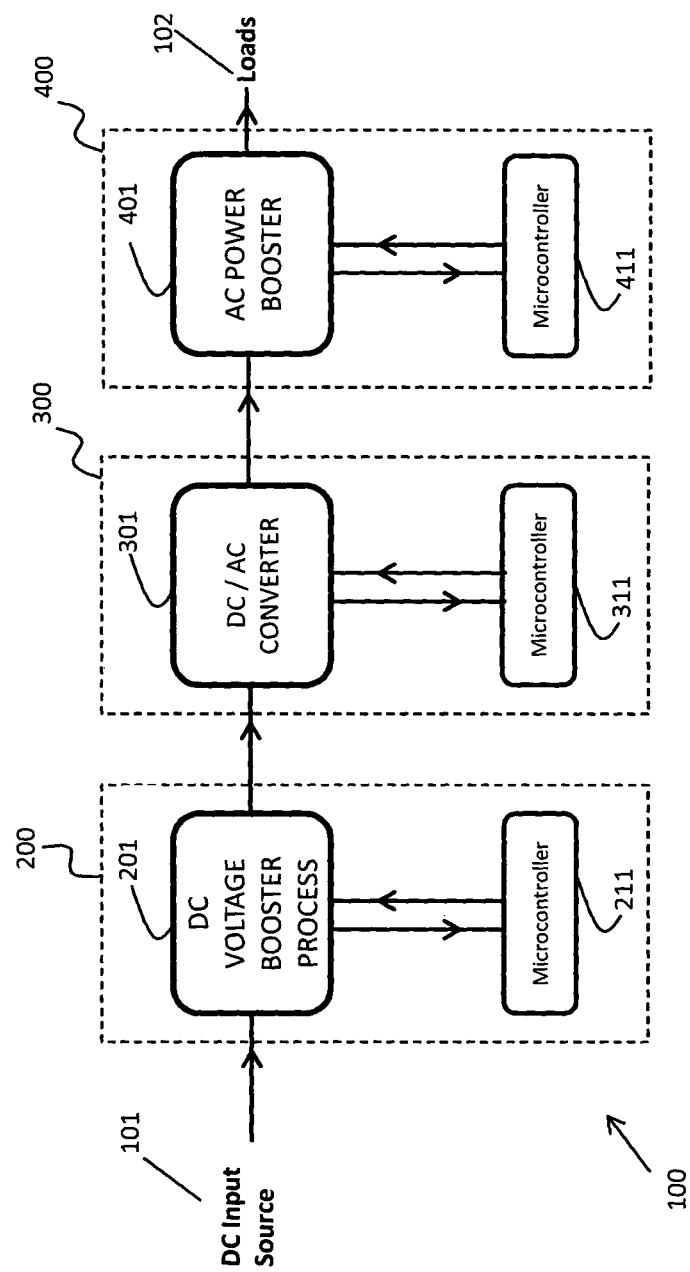
FIG. 1 is a block diagram of a DC to AC power enhancer system.

In accordance with one aspect of the present invention, there is provided an apparatus for enhancing power output, the apparatus comprising: a thyristor having an anode, a cathode and a gate; and a controller connected to the gate, the cathode and the anode, wherein, when the anode is provided with a voltage, the controller is configured for activating the thyristor to allow current flow between the anode and the gate in a first instance and is configured for activating the thyristor to allow current flow between the gate and the cathode in a second instance so as to provide the cathode with an enhanced voltage, the enhanced voltage being an enhancement of the voltage at the anode.

The controller may activate the thyristor to allow current flow between the anode and the gate in the first instance through a regulating signal and the regulating signal comprising: a first time period having a pulsating wave; and a second time period with voltage rising to the voltage at the anode.

The regulating signal may comprise a third time period having a voltage dropping from the voltage at the anode to a lower voltage; and a fall in voltage to the lower voltage value lasting a fourth time period during the third time period so as to activate the thyristor to allow current flow between the gate and the cathode in the second instance.

Time difference between the first instance and the second instance may be in order of microseconds, or shorter to an extent that would still provide the enhanced voltage at the cathode.

The apparatus may comprise a capacitor arranged at the gate to supplement the voltage at the cathode.

The apparatus may comprise a Direct Current (DC) source, and a switch for switching the switch to lead current from the DC source to the anode when the controller detects that voltage of the DC source is below a threshold value, and for switching the switch to lead current to an output terminal connected to the cathode when the controller detects that voltage of the DC source is above the threshold value.

The apparatus may comprise one or more capacitors arranged in parallel to the switch, the controller being configured to enable current discharged from the one or more capacitors to flow to the switch if the voltage of the DC source is below the threshold value.

The apparatus may comprise one or more Insulated Gate Bipolar Transistor (IGBT) controlled by the controller to convert the voltage at the cathode into an Alternating Current (AC) signal, wherein the controller is configured for detecting energy loss caused by the one or more IGBT and for adjusting a compensation circuit to compensate the energy loss based on the energy loss detected.

The apparatus may comprise one or more resistors arranged between the cathode and the anode for adjusting resistance.

The controller may be configured for monitoring voltage at the anode or the cathode for leading current at the respective anode or cathode to the one or more resistors based on the monitored voltage.

The apparatus may comprise one or more resistors arranged between the cathode and the anode and between the anode and the gate for adjusting resistance at the cathode.

The controller may be configured for monitoring resistance value at the anode, the gate or the cathode for leading current at the respective anode, gate or cathode to the one or more resistors based on the monitored resistance value.

The controller may be configured for monitoring voltage at the anode of the thyristor for leading current to a diode based on the monitored voltage, the diode comprising with a diode anode for receiving current from the anode of the thyristor and a diode cathode connected to the gate of the thyristor.

The controller may activate the thyristor to allow current at the cathode to increase by 1% through the regulating signal prior to an increase of voltage at the cathode to the enhanced voltage.

The apparatus may comprise a second thyristor comprising: an anode for receiving the enhanced voltage; a gate for connecting to a load; and a cathode for connecting to the load.

The controller may activate the thyristor to allow current flow between the anode and the gate in the first instance until resistance value calculated at the anode is similar to resistance value calculated at the gate for a first time period.

The controller may activate the thyristor to allow current flow between the gate and the cathode in the second instance until resistance value calculated at the anode is similar to resistance value calculated at the cathode for a second time period.

The second period may be longer than the first period.

The controller may activate the thyristor to allow current flow between the anode and the gate in the first instance until voltage at the anode is similar to voltage at the gate for a first time period.

The controller may activate the thyristor to allow current flow between the gate and the cathode in the second instance until voltage at the anode is similar to voltage at the cathode for a second time period.

The second period may be longer than the first period.

The regulating signal may comprise a fifth time period having a voltage rising from a negative peak voltage to zero voltage; and a rise in voltage lasting a sixth time period during the fifth time period so as to activate the thyristor to allow current flow between the anode and the gate in the first instance.

In accordance with another aspect of the present invention, there is provided a method for enhancing power output of an apparatus comprising a thyristor having an anode, a cathode and a gate, the anode being provided with a voltage, the method comprising: activating the thyristor to allow current flow between the anode and the gate in a first instance; and activating the thyristor to allow current flow between the gate and the cathode in a second instance, so as to provide the cathode with an enhanced voltage, the enhanced voltage being an enhancement of the voltage at the anode.

The method may comprise activating the thyristor to allow current flow between the anode and the gate in the first instance through a regulating signal, the regulating signal comprising: a first time period having a pulsating wave; and a second time period with voltage rising to the voltage at the anode.

The regulating signal may comprise a third time period having a voltage dropping from the voltage at the anode to a lower voltage; and a fall in voltage to the lower voltage value lasting a fourth time period during the third time period so as to activate the thyristor to allow current flow between the gate and the cathode in the second instance.

Time difference between the first instance and the second instance may be in order of microseconds, or shorter to an extent that would still provide the enhanced voltage at the cathode.

The method may comprise supplementing voltage at the cathode with current discharged from a capacitor arranged at the gate.

The method may comprise switching a switch to lead current from a DC source to the anode when the controller detects that voltage of the DC source is below a threshold value; and switching a switch to lead current to an output terminal connected to the cathode when the controller detects that voltage of the DC source is above the threshold value.

The method may comprise enabling current discharged from one or more capacitors arranged in parallel to the switch to flow to the switch if the voltage of the DC source is below the threshold value.

The method may comprise converting voltage at the cathode into an Alternating Current (AC) signal using one or more Insulated Gate Bipolar Transistor (IGBT) controlled by the controller; detecting energy loss caused by the one or more IGBT; and adjusting a compensation circuit to compensate the energy loss based on the energy loss detected.

The method may comprise adjusting resistance using one or more resistors arranged between the cathode and the anode.

The method may comprise leading current at the anode or the cathode to the one or more resistors based on voltage monitored voltage at the respective anode or cathode.

The method may comprise adjusting resistance using one or more resistors arranged between the cathode and the anode and between the anode and the gate.

The method may comprise leading current at the anode, the gate or the cathode to the one or more resistors based on monitored resistance value at the respective anode, gate or cathode.

The method may comprise monitoring voltage at the anode of the thyristor for leading current to a diode based on the monitored voltage, the diode comprising with a diode anode for receiving current from the anode of the thyristor and a diode cathode connected to the gate of the thyristor.

The method may comprise activating the thyristor to allow current at the cathode to increase by 1% through the regulating signal prior to an increase of voltage at the cathode to the enhanced voltage.

The method may comprise leading current to an anode of a second thyristor from the cathode of the thyristor to apply the enhanced voltage to the anode of the second thyristor, a gate and a cathode of the second thyristor being connected to a load.

The method may comprise activating the thyristor to allow current flow between the anode and the gate in the first instance until resistance value calculated at the anode is similar to resistance value calculated at the gate for a first time period.

The method may comprise activating the thyristor to allow current flow between the gate and the cathode in the second instance until resistance value calculated at the anode is similar to resistance value calculated at the cathode for a second time period.

The second period may be longer than the first period.

The method may comprise activating the thyristor to allow current flow between the anode and the gate in the first instance until voltage at the anode is similar to voltage at the gate for a first time period.

The method may comprise activating the thyristor to allow current flow between the gate and the cathode in the second instance until voltage at the anode is similar to voltage at the cathode for a second time period.

The second period may be longer than the first period.

The regulating signal may comprise a fifth time period having a voltage rising from a negative peak voltage to zero voltage; and a rise in voltage lasting a sixth time period during the fifth time period so as to activate the thyristor to allow current flow between the anode and the gate in the first instance.

DETAILED DESCRIPTION

FIG. 1 is a block diagram of a DC to AC power enhancer system 100. It is appreciated that the DC to AC power enhancer system 100 could be implemented as an apparatus, or more specifically, a circuit board. The power enhancer system 100 accepts DC input power from a DC source 101 (also known as DC input source) and supplies AC output power. The DC source 101 may for instance be a distributed power generator relying on solar power or any other DC sources such as batteries, wind turbines, hydro-turbines, ultra-capacitors and any other Direct Current power source.

The power enhancer system 100 comprises a DC voltage booster subsystem 200, a DC to AC conversion sub-system 300 and an AC power booster subsystem 400.

The DC voltage booster processing system 200 comprises a DC voltage booster 202 that is connected to a microcontroller 211. The DC voltage booster processing system 200 takes its input from the DC source 101 whose voltage can fluctuate, typically between 12 to 45 Volts for a distributed power generator relying on solar power. The DC voltage booster 202 supplies a DC voltage of a particular waveform to the DC to AC conversion subsystem 300, in accordance to conversion and switching control signals received from the microcontroller 211. The DC voltage booster processing system 200 is used to enhance and stabilize the DC output voltages from the DC source 101. By regulating the DC output voltages from the DC source 101, more accurate DC to AC conversion can be performed by the DC to AC conversion subsystem 300.

The DC to AC conversion subsystem 300 comprises a DC to AC converter 301 and a microcontroller 311. In other examples, the microcontroller 311 and the microcontroller 211 could be one and the same physical microcontroller. The same physical microcontroller could have separate input and output pins for the operations of the microcontroller 311 and run separate logical algorithms from that of the microcontroller 211. The DC to AC converter 301 takes its input from the output of the DC voltage booster 201. The DC to AC converter 301 is further coupled to the microcontroller 311 and supplies an AC voltage to the AC power booster subsystem 400 in accordance to conversion and switching control signals received from the microcontroller 311.

The AC power booster subsystem 400 comprises an AC power booster 401 that is connected to a microcontroller 411. In other examples, the microcontroller 411, the microcontroller 211 and/or the microcontroller 311 could be one and the same physical microcontroller. The same physical microcontroller could have separate input and output pins for the operations of microcontrollers 211 and/or the microcontroller 311, and run separate logical algorithms from that of the microcontroller 211 and/or the microcontroller 311. The AC power booster 401 takes its input from the output of the DC to AC converter 301. The AC power booster 401 is further coupled to the microcontroller 411 and supplies enhanced AC power to one or more connected loads 102 in accordance to conversion and switching control signals received from the microcontroller 411. The AC power booster 401 outputs an AC voltage that is stable and usable by the one or more connected loads 102.

It is appreciated that in other examples, there could be just one microcontroller operating the functions of the microcontrollers 211, 311 and/or 411. For simplicity, in the illustrations as follows, the use of one microcontroller 211 to carry out the functions of the three microcontrollers (i.e. 211, 311 and 411) as discussed would be described.

The words 'boost' and 'booster' are used interchangeably with the words 'enhance' and 'enhancer' respectively. It is appreciated that voltage or power enhancement does not necessarily mean providing increased voltage and/or current. It covers enhancement on the power output to provide sufficient drive at a specific voltage and/or current to, for instance, support more loads. Providing sufficient drive may not necessarily involve increased voltage or current. Enhancement by providing increased voltage is illustrated by the DC voltage booster 202. Enhancement by providing sufficient drive for more loads is illustrated by the AC power booster 401.

Figure 2A:
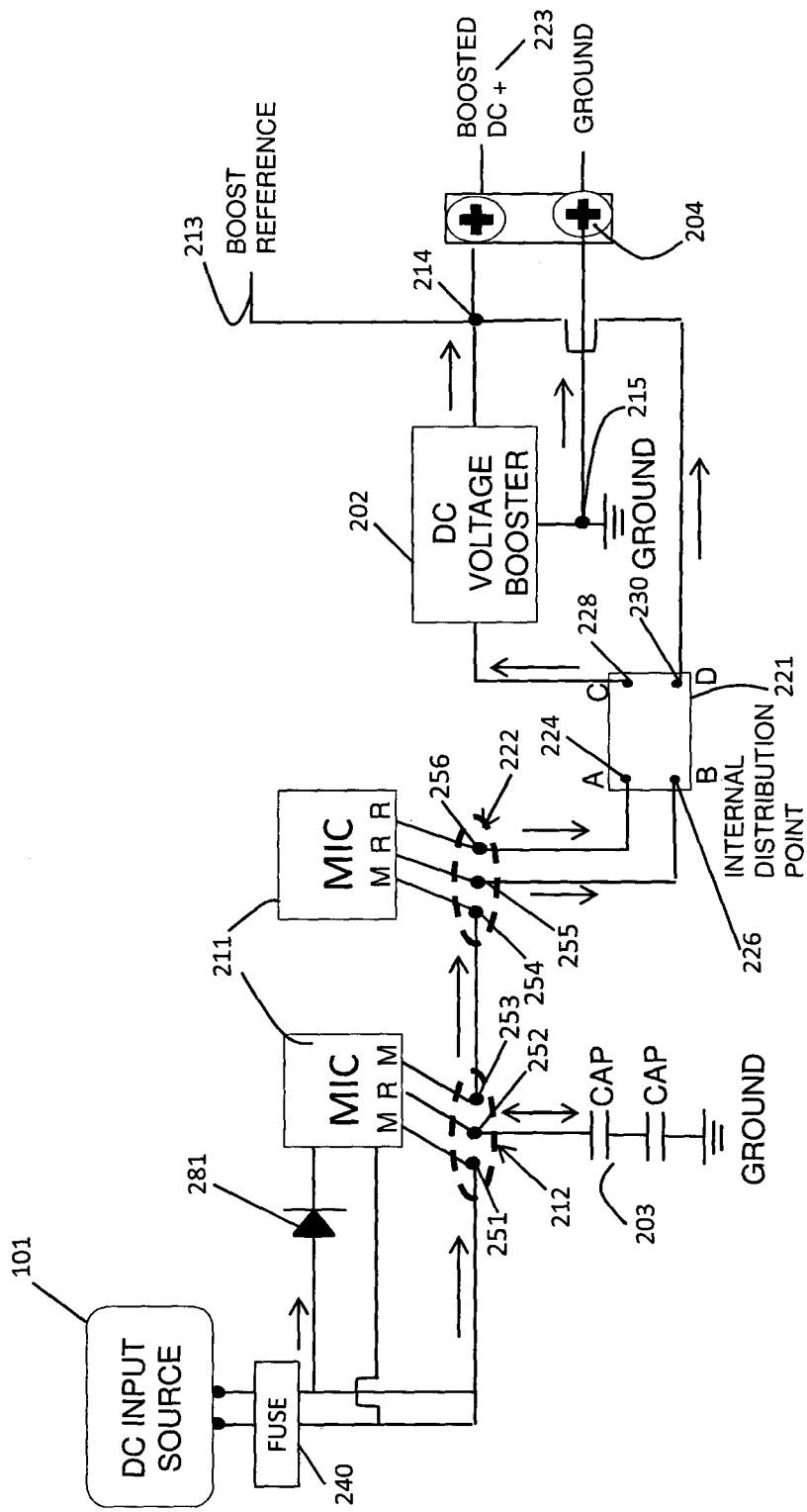
FIG. 2A is a circuit diagram of a DC voltage booster processing system.

FIG. 2A is an example of the circuit diagram of the DC voltage booster subsystem 200 in FIG. 1. The DC input source 101 in FIG. 1 is connected to two capacitors 203, the microcontroller 211 and a circuit juncture 212 through a fuse 240, which provides overcurrent protection. The DC input source 101 provides current to a diode 281 having its diode cathode end connected to the microcontroller 211. The diode 281 adjusts the current flow to the microcontroller 211 to provide a stable power supply of, for instance, 2 to 5 Volts for the microcontroller 211 to operate. Furthermore, the circuit juncture 212 is connected to a circuit juncture 222. Both circuit junctures 212 and 222 are individually connected to the microcontroller 211.

Figure 2B:
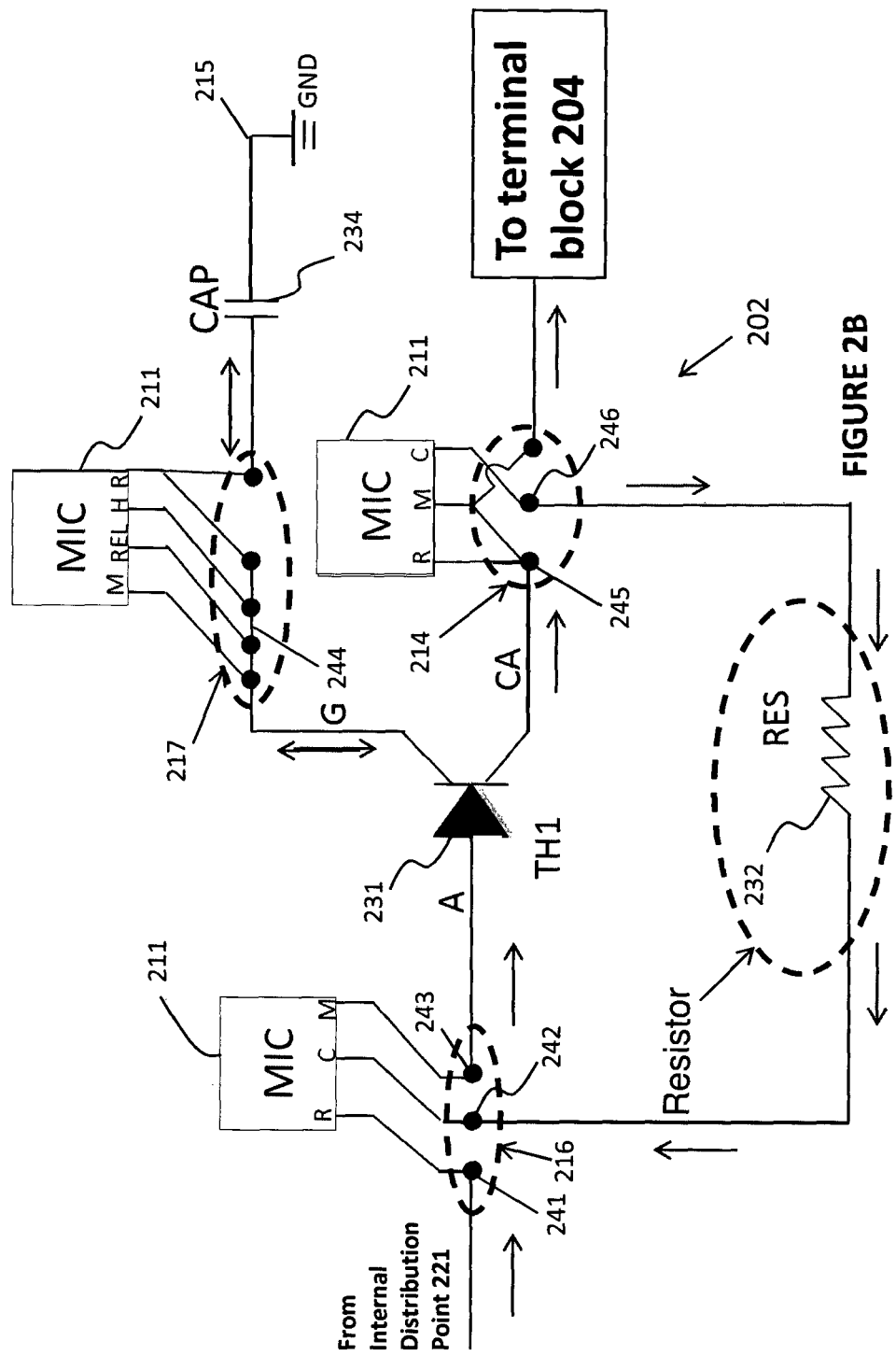
FIG. 2B is a detailed circuit diagram of a DC voltage booster.
Figure 4:
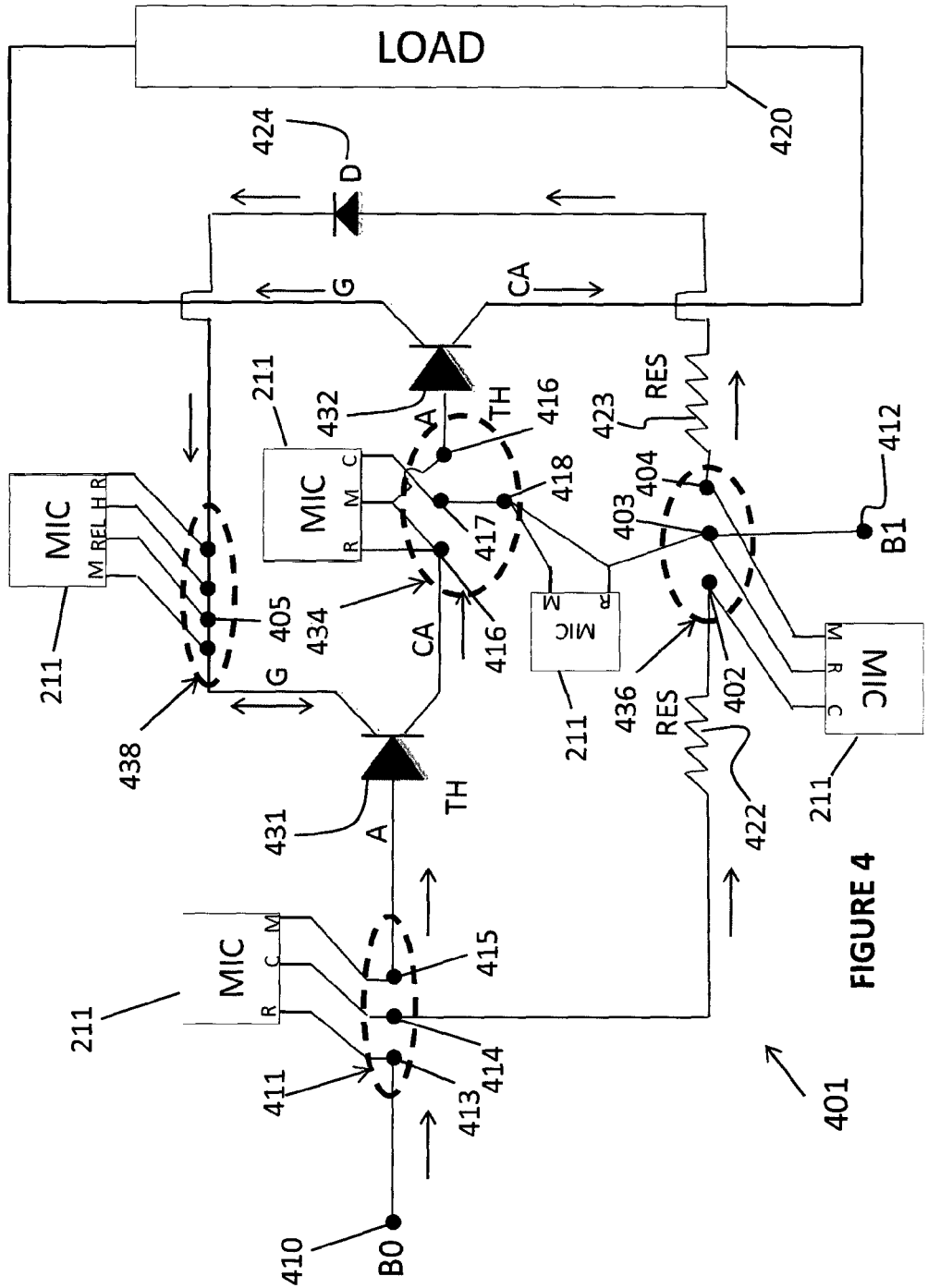
FIG. 4 is a circuit diagram of an AC power booster.

It is appreciated that in FIGS. 2A, 2B and 4, the same microcontroller 211 is drawn at each circuit juncture of interest to illustrate its connection to the respective circuit junctures.

At circuit juncture 212, the microcontroller 211 has one 'R' pin for regulating current/voltage and two 'M' pins for monitoring current/voltage connected to corresponding circuit points 251, 252 and 253. Circuit point 251 is in turn connected to the DC input source 101 through the fuse 240. Circuit point 252 is connected to the capacitors 203 and circuit point 253 is connected to point 254 of circuit juncture 222.

The 'M' pin connected to point 251 monitors incoming DC voltage values from the DC input source 101 after going through the fuse 240. When the DC voltage monitored at point 251 is greater than or equal to, in this example, 35 Volts, the 'R' pin connected to point 212 enables current to flow from points 251 to 253 through the microcontroller 211 and from points 251 to 252 through the microcontroller 211 to charge the capacitors 203. When the DC voltage monitored at point 251 is lesser than, in this example, 35 Volts, the 'R' pin enables current to flow from points 251 to 252 and from points 252 to 253 through the microcontroller 211 to allow the capacitors 203 to discharge At circuit juncture 222, the microcontroller 211 has two 'R' pins for regulating current/voltage and one 'M' pin for monitoring current/voltage connected to corresponding circuit points 254, 255 and 256. Circuit point 254 is in turn connected to point 253 of circuit juncture 212. Circuit point 255 is connected to input B 226 of the internal distribution point 221. Circuit point 256 is connected to input point A 224 of the internal distribution point 221.

The 'M' pin connected to point 254 monitors voltage value at point 254, which have the same voltage value as point 253. If the voltage value at point 254 is between a certain range, in this example, 12 to 34 Volts, current is enabled to flow from points 254 to 256. If voltage value at point 254 is greater than or equal to, in this example, 35 Volts, current is enabled to flow from points 254 to 255.

The 'R' pins connected at circuit junctures 212 and 222 are configured to help regulate the current flow and voltage at the various circuit junctures and the 'M' pins connected at circuit junctures 212 and 222 are configured for monitoring the voltage and current values at the respective circuit junctures.

The internal distribution point 221 is a switch that is connected to the microcontroller 211. The internal distribution point 221 has two inputs A 224 and B 226 and two outputs C 228 and D 230. The circuit juncture 222 splits into two separate lines i.e. through points 256 and 255 that are each connected to the input A 224 and the input B 226 of the internal distribution point 221 respectively. The output C 228 of the internal distribution point 221 is coupled to an input of a DC voltage booster 202. An output of the DC voltage booster 202 is connected to a circuit juncture 214. The output D 230 of the internal distribution point 221 is connected to the output of the DC voltage booster 202 at the circuit juncture 214. The switching of the internal distribution point 221 is controlled via the 3 pins of the microcontroller 211 that are connected to points 254, 255 and 256.

The DC voltage booster 202 is connected to ground at a circuit point 215. The circuit point 215 is coupled to a ground point (i.e. negative terminal) of a terminal block 204. The output of the DC voltage booster 202 is also connected to the terminal block 204 through the circuit juncture 214. The circuit juncture 214 is connected to a positive terminal 223 of the terminal block 204 to provide the boosted DC voltage provided by the DC Voltage booster 202, if necessary.

To illustrate the voltage enhancing ability of the DC voltage booster subsystem 200, a case where the DC input source 101 is a solar panel providing an unstable supply of 12 to 45 Volts, and the DC voltage booster subsystem 200 is to obtain a stable DC supply of 35 Volts by boosting the unstable supply of 12 to 45 Volts from the DC input source 101 is considered as follows. For the unstable supply of 12 to 45 Volts, the rating of the fuse 240 could be set as 45 Volts or higher.

The microcontroller 211 controls the connection patches in the internal distribution point 221 according to the following steps. Where the DC input source 101, coupled to the capacitor 203 is monitored to be stable at or higher than a preset desired voltage reference (213 in FIG. 2A), in this case, 35 Volts, the microcontroller releases the voltage energy in capacitor 203 by patching the circuit juncture 212 through to circuit juncture 214. When the microcontroller 211 senses the DC input source 101 is less than the preset desired voltage reference (213 in FIG. 2A) (35 Volts), the patch at the internal distribution point 221 between circuit junctures 212 and 214 will be broken. Rather, the weaker DC source voltage will be released to the DC voltage booster 202 for boosting by patching the internal distribution point 221 accordingly.

With regard to the input A 224 of the internal distribution point 221, if the microcontroller 211 determines the voltage at the circuit juncture 222 via the 'M' pin connected to point 254 to be between 12-34 Volts, the microcontroller 211 would control the internal distribution point 221 to patch input A 224 to the output C 228. After patching input A 224 to the output C 228, the DC voltage booster 202 would receive the voltage at the circuit juncture 222 of between 12-34 Volts and would be activated to provide a boost to the 12-34 Volts to try and achieve the desired 35 Volts DC output at the circuit juncture 214.

With regard to input B 226 of the internal distribution point 221, if the microcontroller 211 determines that the voltage at the circuit juncture 222 is between 12-34 Volts and determines that charge is available at the capacitors 203, the microcontroller 211 would control the internal distribution point 221 to patch input B 226 to the output D 230 so that the charge in the capacitors 203 would be drawn through input B 226 and be directed to the output D 230. The necessary controlling would be done by the microcontroller 211 via the 3 pins connected to 251, 252 and 253 and the 3 pins connected to points 254, 255 and 256 to enable the charge in the capacitors 203 to be drawn through input B 226 to be directed to the output D 230. The microcontroller 211 determines whether charge is available at the capacitors 203 by monitoring the Voltage level at circuit juncture 212 via one or both of the 'M' pins connected to points 251 and 253.

The microcontroller 211 is configured to monitor circuit juncture 212 for the flow of the supply and check the condition whether the voltage is equal to or greater than 35 Volts. If the voltage is equal or greater to 35 Volts as determined via one or both of the 'M' pins connected to points 251 and 253 at circuit juncture 212, the capacitors would be charged. If not, the microcontroller 211 would start to monitor the circuit juncture 222.

At circuit juncture 222, the microcontroller 211 checks whether backup charge is available at the capacitors 203 when the Voltage at circuit juncture 222 is detected to be lesser than 35 Volts via the 'M' pin connected to point 254. If backup charge is available at the capacitors 203, it will withdraw charge from the capacitors 203 to release the required voltage. Otherwise, the microcontroller 211 will patch input A 224 to the output C 228 to direct the voltage of lesser than 35 Volts at circuit juncture 222 to the DC Voltage booster for boosting. Whether backup charge is available or not can be deduced via one or more of the microcontroller pins connected to points 251, 252 and 253 of the circuit juncture 212.

More details to obtain the preset desired voltage reference (213 in FIG. 2A) through the DC voltage booster subsystem 200 of, in this case, 35 Volts is provided as follows with reference to FIG. 5.

Figure 5:
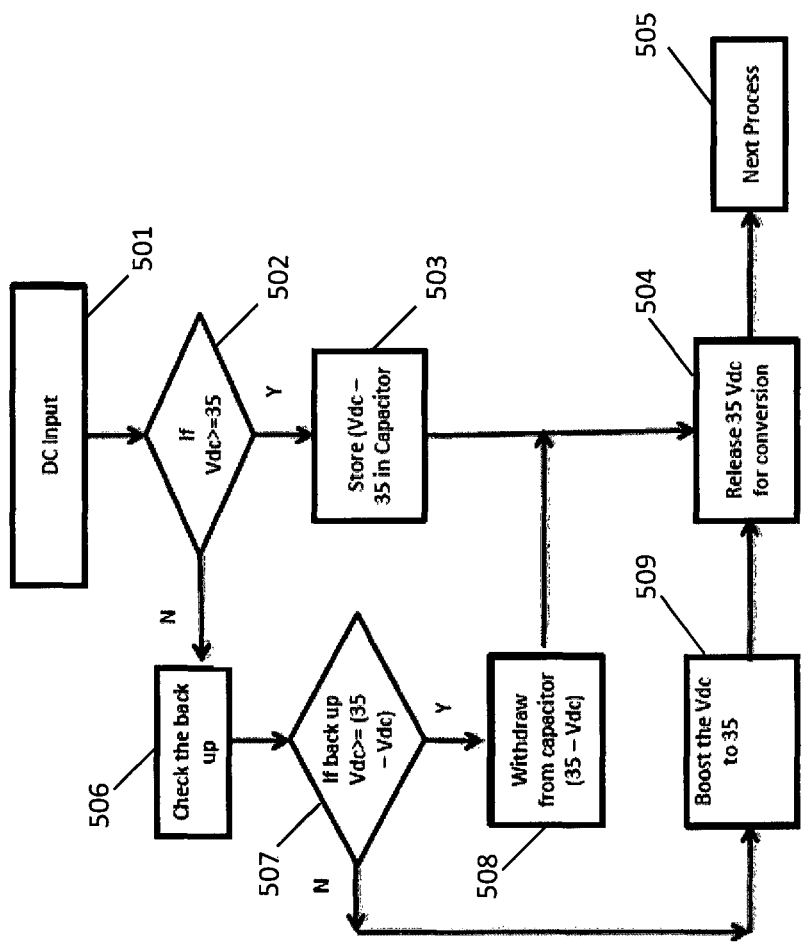
FIG. 5 shows a flowchart illustrating steps taken at the DC booster processing system.

FIG. 5 shows a flowchart illustrating the steps taken to provide the DC boosting provided by the DC conversion sub-system 200. In this instance, a stable DC output of 35 Volts is to be obtained from the DC input source 101, which is providing DC Voltage fluctuating between 12 and 45 Volts. Reference is made to components in FIGS. 2A and 2B.

At step 501, the microcontroller 211 monitors the fluctuating DC input source 101 at circuit juncture 212 via one or both the 'M' pins connected to points 251 and 253 in FIG. 2A.

At step 502, the microcontroller 211 checks if the Voltage of the DC input source 101, Vdc, is greater than or equal to a predetermined 35 Volts at circuit juncture 212 via one or both the 'M' pins connected to points 251 and 253 in FIG. 2A.

If Vdc is greater than or equal to 35 Volts at step 502, the microcontroller 211 enables the voltage energy of the Vdc that is greater than 35 Volts to be stored into the capacitors 203 at step 503 via one or more of the pins connected to points 251, 252 and 253 in FIG. 2A and at the same time releases the voltage energy of Vdc in the capacitors 203 by patching the circuit juncture 212 through to circuit juncture 214 i.e. patching input B 226 to the output D 230 in FIG. 2A at step 504 and disconnecting input A 224 to the output C 228 in FIG. 2A. After step 504, the circuit juncture 214 would provide a DC output of 35 Volts at circuit juncture 214 in FIG. 2A and this output would be channeled to the next stage for further processing at step 505.

If Vdc is lesser than 35 Volts at step 502, the microcontroller 211 would check and look for back up charge supply from the capacitors 203 at step 506 via one or more of the pins connected to points 251, 252 and 253 in FIG. 2A.

After step 506, the microcontroller 211 checks at circuit juncture 222, via one or more of the pins connected to points 254, 255 and 256 in FIG. 2A, if the back up Voltage supply at the capacitors 203, Vdc (backup), is greater than 35 Vdc at step 507.

If Vdc (backup) is greater than or equal to 35 Volts at step 507, the microcontroller would, via control of one or more of the pins connected to points 251, 252, 253, 254, 255 and 266 in FIG. 2A, withdraw the voltage energy from the capacitors 203 at step 508 and release the voltage energy of Vdc in capacitors 203 by patching the circuit juncture 212 through to circuit juncture 214 at step 504 i.e. patching input B 226 to the output D 230 in FIG. 2A and disconnecting input A 224 to the output C 228 in FIG. 2A. After step 504, the circuit juncture 214 would provide a DC output of 35 Volts at circuit juncture 214 in FIG. 2A and this output would be channeled to the next stage for further processing at step 505.

If Vdc (backup) is lesser than 35 Volts at step 507, boosting would be performed by the DC voltage booster 202 to bring the Vdc to 35 Volts at step 509. After boosting is done, the microcontroller 211 would, via control of one or more of the pins connected to points 251, 252, 253, 254, 255 and 266 in FIG. 2A, release the voltage energy of Vdc in the capacitors 203 by patching the circuit juncture 212 through to circuit juncture 214 at step 504 i.e. patching input A 224 to the output C 228 in FIG. 2A and disconnecting input B 226 to the output D 230 in FIG. 2A. After step 504, the circuit juncture 214 would provide a DC output of 35 Volts at circuit juncture 214 in FIG. 2A and this output would be channeled to the next stage for further processing at step 505.

Details on the DC boosting performed by the DC voltage booster 202 at step 509 would be provided as follows.

FIG. 2B is an example of a circuit diagram of the DC voltage booster 202 in FIG. 2A. The DC voltage booster 202 comprises a thyristor 231, a resistor 232 and a capacitor 234. It is appreciated that the resistor 232 could be made up of one or more variable or non-variable resistors. The thyristor 231 could be a silicon controlled rectifier thyristor or any other similar thyristor. The gate (corresponding with circuit juncture 217) of the thyristor 231 is connected to one end of capacitor 234. In this case, the capacitor is charged whenever possible and when more than 12 Volts is received by the DC voltage booster 202 at the circuit juncture 222 after patching input A 224 to the output C 228. The cathode (corresponding with circuit juncture 214) of the thyristor 231 is connected to the circuit juncture 214 and the anode (corresponding with circuit juncture 216) of the thyristor 231 is connected to output C 228. The cathode (corresponding with circuit juncture 214) and the anode (corresponding with circuit juncture 216) of the thyristor 231 are coupled through the resistor 232.

The microcontroller 211 is coupled to the DC voltage booster 202 at circuit junctures 214, 216 and 217. More specifically, at circuit juncture 216, 3 pins of the microcontroller 211, namely 'R' for regulating, 'C' for comparator and 'M' for monitoring are connected to corresponding circuit points 241, 242 and 243 respectively. Circuit point 241 is in turn connected to output C 228 in FIG. 2A of the internal distribution point 221. Circuit point 242 is connected to the resistor 232 and circuit point 243 is connected to the anode of the thyristor 231.

At circuit juncture 214, 3 pins of the microcontroller 211, namely 'R' for regulating, 'M' for monitoring and 'C' for comparator are connected as follows. The 'R' and 'M' pins of the microcontroller 211 at circuit juncture 214 are connected to a circuit point 245 that is in turn connected to the cathode of the thyristor 231 and the terminal block 204. The 'C' pin of the microcontroller 211 at circuit juncture 214 is connected to a circuit point 246 that is in turn connected to the resistor 232.

At circuit juncture 217, 4 pins of the microcontroller 211, namely 'M' for monitoring, 'REL' for release, 'H' for hold and 'R' for regulating are all connected to one circuit point 244. Circuit point 244 is connected to the capacitor 234 and the gate of the thyristor 231.

In total, 10 pins of the microcontroller 211 are utilised at all 3 circuit junctures, 214, 216 and 217 and each pin is different from the other in this example. It is possible that one pin may be used at more than one circuit point by adjusting the algorithm run by the microcontroller 211.

The 'R' pins are configured to help regulate the current flow and voltage at the various circuit points. 'R' pins may transmit regulating signals to activate the thyristor 231 for certain functions.

The 'M' pins are configured for monitoring the voltage and current values at the various circuit points.

The 'C' pins are configured for comparing voltage and/or current values or calculated resistance values based on the voltage and current values at the respective circuit points with predetermined threshold values.

The 'H' pin is configured to enable accumulation of charge at the gate (i.e. circuit juncture 217) of the thyristor 231. The 'H' pin may transmit a hold signal, which in the present example could be a fixed 5 Volts signal, to work in conjunction with the regulating signal of the 'R' pin to activate the thyristor 231 in order of microseconds, e.g. including 0.001 to 2 microseconds to conduct current from the anode (circuit juncture 216) of the thyristor 231 to the gate (circuit juncture 217) of the thyristor 231 so that the voltage at the anode, $V_A$, would become similar to the voltage at the gate, $V_G$, of the thyristor 231 for a first time range. During the period of the hold signal, the voltage at the cathode, $V_C$, of the thyristor 231 would remain low at about 2 Volts in the present example.

The 'REL' pin is configured to enable releasing of accumulated charge at the gate (i.e. circuit juncture 217) of the thyristor 231 when the thyristor 231 has been activated to conduct current from the gate (circuit juncture 217) to the cathode (circuit juncture 214). The 'REL' pin may transmit a release signal, which in the present example could be a fixed 2 Volts signal, to work in conjunction with the regulating signal of the 'R' pin to activate the thyristor 231 in order of microseconds, e.g. including 0.001 to 2 microseconds, to conduct current from the gate (circuit juncture 217) to the cathode (circuit juncture 214) so that the voltage at the gate, $V_G$, would become similar to the voltage at the cathode, $V_C$, of the thyristor 231 for a second time range. During the period of the release signal, the voltage at the cathode, $V_C$, would rise up initially and follow the value of the voltage at the gate, $V_G$, for a time period before falling.

From observation, the second time range where $V_G$ is similar to $V_C$ is longer than the first time range where $V_A$ is similar to $V_G$. The longer it is, the better is the voltage enhancement at the cathode of the thyristor 231.

In addition, with regard to circuit juncture 216, the 'M' pin (connected to point 243) is also configured as an output for current flow from input received at the 'R' pin (connected to point 241) by the microcontroller 211 or input received at the 'C' pin (connected to point 242) to the anode of the thyristor 231 by the microcontroller 211 at the appropriate time. Similarly, the 'C' pin connected to point 246 at the circuit juncture 214 is configured as an output for current flow from input received at the 'R' pin (connected to point 245) by the microcontroller 211 or input received at the 'M' pin (connected to point 245) to the resistor 232 by the microcontroller 211 at the appropriate time. With current flow being controlled in this case, resistance can be adjusted to affect voltage. Hence, the purpose of resistor 232 is to help to adjust, in this case to gain, resistance and in the process increase or maintain the desired voltage required.

For instance, the microcontroller 211 is configured to monitor the voltage at circuit juncture 214 using the 'M' pin connected to circuit point 245. If the 'C' pin of microcontroller 211 to circuit point 246 detects that the voltage at circuit juncture 214 is lesser than or equal to 35 Volts, the microcontroller 211 could be configured to move on to monitor circuit juncture 222 in the manner described earlier with reference to FIG. 2A.

With regard to the capacitor 234, it is automatically charged whenever there is an excess of charge beyond a certain threshold at the gate of the thyristor 231, for instance, whenever the voltage at the gate, $V_G$, is greater than 12 Volts.

When the voltage of the DC input source 101 at circuit juncture 216 is detected by the 'C' pin of the microcontroller 211 to be lower than the desired voltage reference (213 in FIG. 2A) i.e. 35 Volts, but higher than 12 Volts, which is the lower limit of the possible fluctuation of the DC input source 101 (i.e. 12 to 45 Volts), the thyristor 231 would be set into forward conducting mode by a signal from the 'R' pin of the microcontroller 211 connected to circuit point 244 and current would be passed from its anode (corresponding with circuit juncture 216) to its cathode (corresponding with circuit juncture 214).

Voltage energy stored in the capacitor 234, if sufficient, would be utilised to provide the boost to supplement the voltage at circuit juncture 214 to the desired voltage reference (213 in FIG. 2A) of 35 Volts when the voltage at circuit juncture 216 is detected by the 'C' pin of the microcontroller 211 to be lesser than 35 Volts. More details to obtain the preset desired voltage reference (213 in FIG. 2A) of, in this case, 35 Volts is provided as follows.

Figure 6:
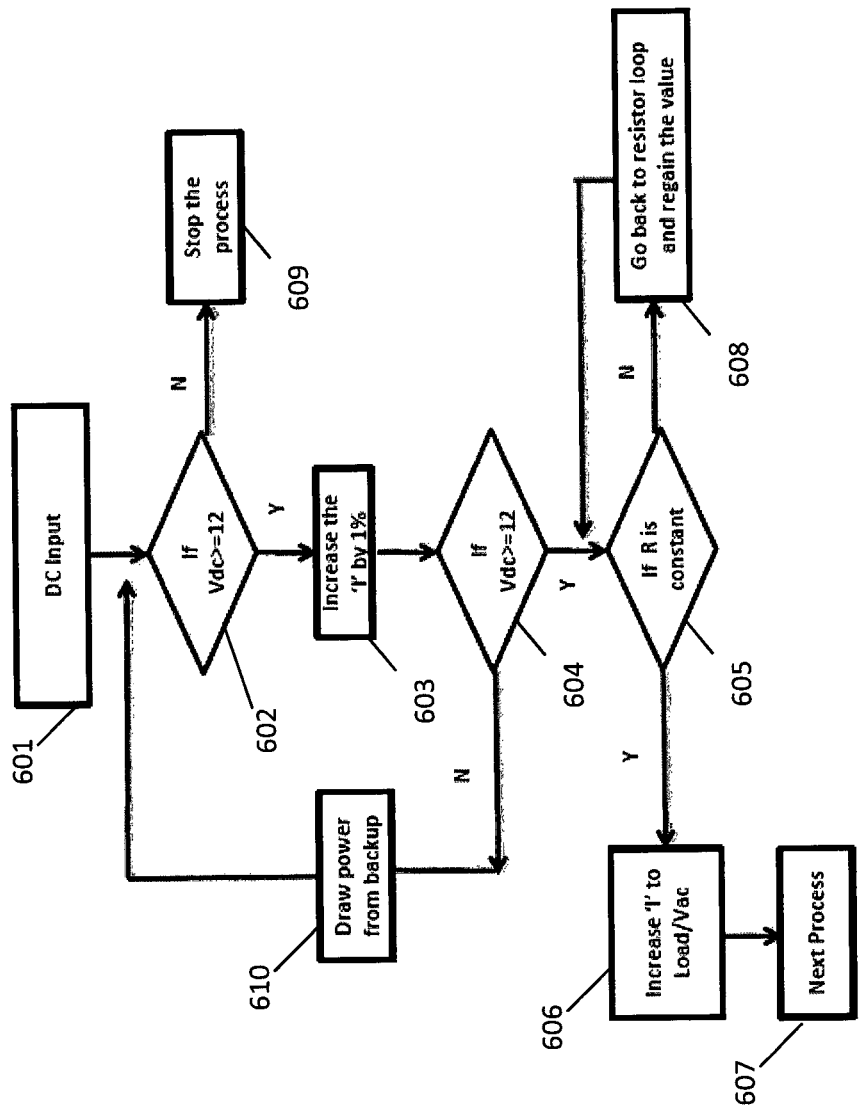
FIG. 6 shows a flowchart illustrating steps taken at the DC voltage booster.

FIG. 6 shows a flowchart illustrating the steps taken to provide the DC boosting performed by the DC voltage booster 202. In this instance, a DC output of 35 volt is to be obtained. Reference is made to the components in FIGS. 2A and 2B.

At step 601, the microcontroller 211 monitors the fluctuating DC input source 101 at circuit juncture 216 using the 'M' pin connected to circuit point 243.

At step 602, the 'C' pin of the microcontroller 211 checks if the Voltage of the DC input source 101, Vdc, at circuit juncture 216 is greater than or equal to the lower limit of 12 Volts.

If Vdc is greater than or equal to 12 Volts at step 602, the microcontroller 211 would at step 603 increase the current flow between the gate (circuit juncture 217) of the thyristor 231 and the cathode (circuit juncture 214) of the thyristor 231 by roughly 1%.

More specifically, in order of microseconds, e.g. including 0.001 to 2 microseconds, the microcontroller 211 would at step 603 send a first regulating signal through the 'R' pin connected to circuit point 244 to the gate (circuit juncture 217) of the thyristor 231 to activate the thyristor 231. The 'H' pin sends the hold signal in conjunction with the 'R' pin at this first instance. Once the thyristor 231 is activated by the first regulating signal transmitted in conjunction with the hold signal of the 'H' pin, it is observed that the gate (circuit juncture 217) of the thyristor 231 and the anode (circuit juncture 216) of the thyristor 231 would begin to conduct and the voltage of the gate (circuit juncture 217) of the thyristor 231, $V_G$, would become similar to the voltage at the anode (circuit juncture 216) of the thyristor 231, $V_A$. The sending of the first regulating signal and hold signal is herein referred to as the holding step. It is "holding" in the sense that charge is accumulated or held at the gate of the thyristor 231.

After a short period of transmitting the regulating and hold signals, the microcontroller 211 would send a second regulating signal through the 'R' pin connected to circuit point 244 to the gate (circuit juncture 217) of the thyristor 231 to activate the thyristor 231 to allow current to flow from the gate (circuit juncture 217) of the thyristor 231 to the cathode (circuit juncture 214) of the thyristor 231. The 'REL' pin sends the release signal in conjunction with the 'R' pin at this second instance. Once the thyristor 231 is activated by the second regulating signal transmitted in conjunction with the release signal of the 'REL' pin, it is observed that the gate (circuit juncture 217) of the thyristor 231 and the cathode (circuit juncture 214) of the thyristor 231 would begin to conduct and the voltage of the gate (circuit juncture 217), $V_G$, of the thyristor 231 would become similar to the voltage at the cathode (circuit juncture 214), $V_C$, of the thyristor 231. The sending of the second regulating signal and release signal is herein referred to as the releasing step. It is "releasing" in the sense that charge is accumulated at the gate of the thyristor 231 is being releases to the cathode of the thyristor 231.

After the gate (circuit juncture 217) of the thyristor 231 and the cathode (circuit juncture 214) of the thyristor 231 begin to conduct, the microcontroller 211 sends a third regulating signal through the 'R' pin connected to circuit point 244 to the gate (circuit juncture 217) of the thyristor 231 in conjunction with the hold signal of the 'H' pin. It has been observed that in this third instance, the voltage at the gate, $V_G$, begins to rise. Thereafter, the microcontroller 211 sends a fourth regulating signal through the 'R' pin connected to circuit point 244 to the gate (circuit juncture 217) of the thyristor 231 in conjunction with the release signal of the 'REL' pin. This causes the gate (circuit juncture 217) to conduct with the cathode (circuit 214) again and this time, the voltage at the cathode, $V_C$, would have the risen value of $V_G$. The rise in the $V_C$ value at this instance accounts for the roughly 1% increase in current between circuit juncture 217 and circuit juncture 214.

It is submitted that the use of the thyristor 231 in the manner aforementioned is unconventional and the results are obtained through observations.

If Vdc is lesser than 12 Volts at step 602, nothing is done and the process ends at step 609. 12 Volts is the minimal voltage which the DC input source 101, in this case a solar panel supplying 12-45 Volts, would provide. An undesirable fall in voltage at the circuit juncture 214 would occur when Vdc is lesser than 12 Volts. However, it is expected that such occurrence would be rare in normal operation as 12 Volts is the minimum voltage that the DC input source 101 provides.

After step 603, the microcontroller 211 checks again at step 604 and at circuit juncture 216 to see if the Voltage of the DC input source 101, Vdc, is greater than or equal to the lower limit of 12 Volts using the respective 'C' pin.

If Vdc is greater than or equal to 12 Volts at step 604, the microcontroller 211 would check at step 605 whether a resistance value, R, remains constant from a previous calculation of the R value. The microcontroller 211 makes use of the 'C' pin connected to circuit point 246 to perform the check at step 605. R is calculated from the voltage ($V_G$) and current values at the cathode of the thyristor i.e. at circuit juncture 214, which can be acquired by the microcontroller 211 through the respective 'M' pin connected to circuit point 245.

If Vdc is lesser than 12 Volts at step 604, the microcontroller 211 would draw voltage energy from the capacitor 234, if sufficient, at step 610. If there is sufficient charge, the voltage energy can be drawn by the microcontroller 211 activating the thyristor 231 to allow current to flow from the gate of the thyristor 231 at circuit juncture 217 to the cathode of the thyristor 231 at circuit juncture 214. Similarly, such activation can be done with the appropriate regulating signal through the respective 'R' pin use in conjunction with the release signal through the 'REL' pin. After step 610, step 602 is performed again.

If the resistance value, R, remains constant at step 605, the microcontroller 211 will check through the 'C' pin connected to point 246 whether the current at the cathode (circuit juncture 214) of the thyristor 231 has reached a predetermined current value required to provide sufficient power for a predefined maximum loading condition of the present DC to AC power conversion system (100 in FIG. 1). If not, the current would be increased by repeating the holding step followed by the releasing step one or more times to reach the predetermined current value. Otherwise, the next process to be carried out by the DC to AC conversion subsystem (300 in FIG. 1) would begin.

If the resistance value, R, is not constant at step 605, the microcontroller 211 would at circuit juncture 214 channel the current received by the 'R' and 'M' pins connected to point 245 to output through the 'C' pin connected to point 246 at step 608. What follows after channeling of the current is a repeat of the holding step to accumulate more charge at the gate (circuit juncture 217) of the thyristor 231. This time, the duration of the regulating and hold signal is a few microseconds longer so as to build up the charge at the gate (circuit juncture 217) of the thyristor 231 until it reaches a maximum holding point, which is just before the voltage at the gate, $V_G$, reaches the breaking voltage of the thyristor 231 that can break down the thyristor 231. After reaching the maximum holding point, the releasing step is carried out to release the accumulated charge from the gate (circuit juncture 217) of the thyristor 231 to the cathode (circuit juncture 214) of the thyristor 231. After the releasing step, step 605 is performed again to check whether R is constant with the previous R value that was read.

Figure 9:
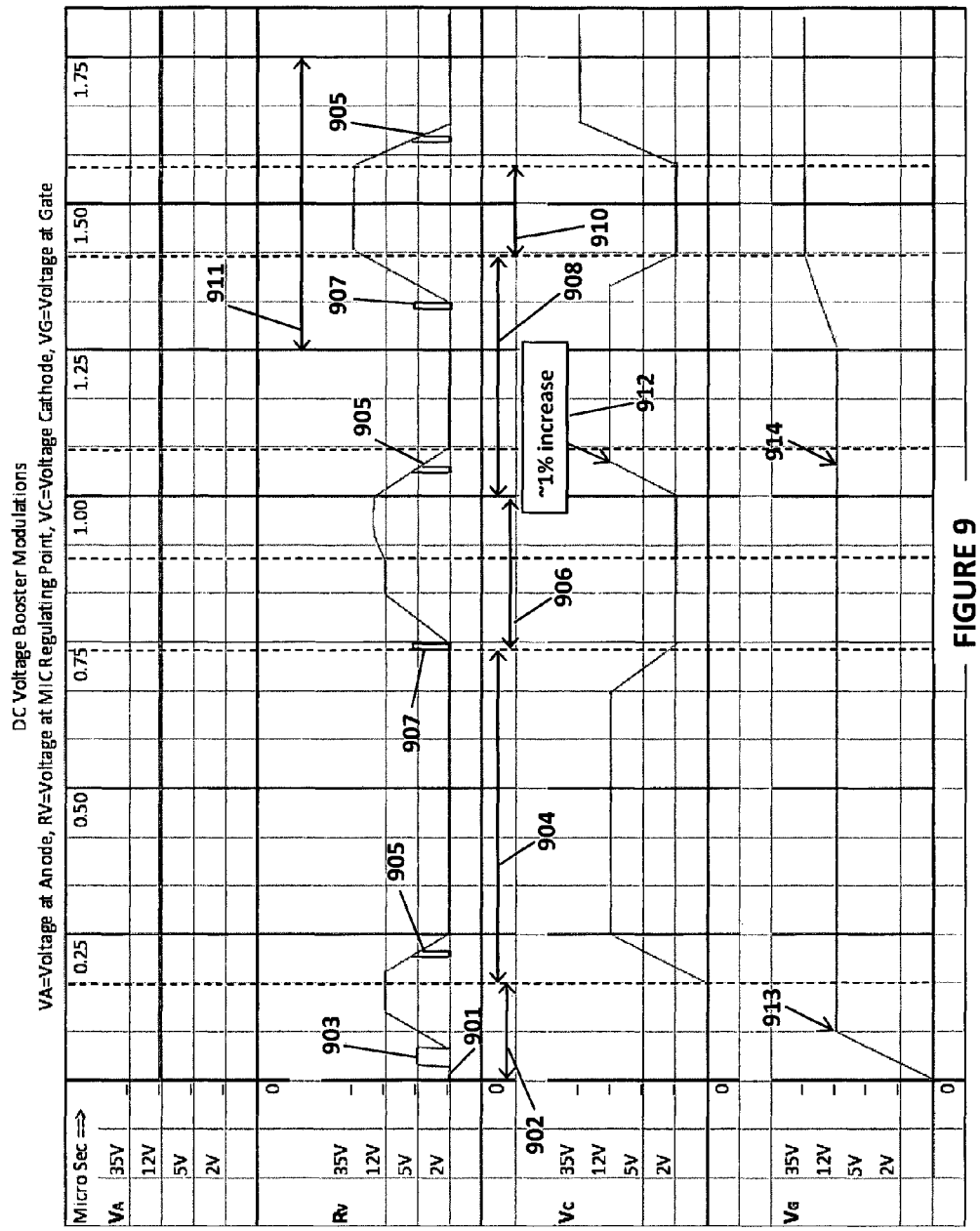
FIG. 9 is a chart illustrating voltage profiles at specific points in the DC voltage booster.

FIG. 9 illustrates an example of DC Voltage boosting conducted at the DC voltage booster 202. In particular, the holding step occurring in a first instance and the releasing step occurring in a second instance are illustrated. The results are obtained from observations. It is noted that although specific timings in order of microseconds, e.g. including 0.001 to 2 microseconds, are provided, they are to be regarded as estimates only and they pertain to one commercially available standard Silicon-Controlled Rectifier (SCR) thyristor. The timings may change depending on the constitution and design of the thyristor being used. It is possible to have timings longer or shorter to an extent that voltage at the cathode of the thyristor is enhanced as desired.

With reference to FIG. 2B, it is assumed in FIG. 9 that the reading at the voltage of the anode (circuit juncture 216) of the thyristor 231, $V_A$, is 12 Volts. The aim is to boost the voltage at the cathode (circuit juncture 217) of the thyristor 231, $V_C$, to achieve a relatively stable 35 Volts (DC) with the 12 Volts at $V_A$. For convenience, in parts of the text as follows, it is understood that the corresponding hold signal or release signal would accompany the regulating signal according to the mention of the holding step and the releasing step described earlier.

At the beginning, the microcontroller 211 sends a regulating signal for a first time period 902 of about 0.167 microseconds. Within the period 902, the regulating signal begins with a pulsating wave 903, firstly at 2 Volts for about 0.0278 microseconds followed by 5 volts for another about 0.0278 microseconds. Thereafter, the regulating signal slopes linearly to 12 Volts for about 0.0556 microseconds in a second time period and plateaus at 12 Volts [i.e. voltage of the anode (circuit juncture 216) of the thyristor 231, $V_A$] for another about 0.0556 microseconds. The pulsating wave 903 of the period 902 is responsible for activating the thyristor 231 to conduct from the anode (circuit juncture 216) to the gate (circuit juncture 217). It is appreciated that the pulsating wave 903 may comprise one or more pulses. The pulsating wave 903 may also be regarded as a spike and need not necessarily be square shaped as shown in FIG. 9. During activation, the voltage at the gate (circuit juncture 217), $V_G$, slopes linearly to about 12 Volts at point 913 in FIG. 9 to the voltage value at the anode (circuit juncture 216) in about 0.0833 microseconds. Once activated, $V_G$ would maintain at 12 Volts until about 1.08 microseconds later where there is a 1% current increase point 914 where $V_G$ also correspondingly increases by 1%. During the period 902, charge is accumulated at the gate (circuit juncture 217), thereby performing the holding step.

After the period 902, the regulating signal undergoes a period 904 of about 0.5833 microseconds, which performs the releasing step, where the thyristor 231 is activated to conduct from the gate (circuit juncture 217) to the cathode (circuit juncture 214). The waveform of the releasing step in period 904 firstly falls generally linearly from 12 Volts to 2 Volts for about 0.0833 microseconds in a third time period but at about midway, there is present a sharp fall 905 (i.e. a fourth time period) lasting about 0.0167 microseconds. Thereafter, the waveform remains at 2 Volts until about 0.5 microseconds later. The effect of period 904 is that the thyristor 231 releases all the charge accumulated at the gate (circuit juncture 217) during the period 902 to the cathode (circuit juncture 214). This causes the voltage at the cathode (circuit juncture 214), $V_C$, to slope linearly to about 12 Volts at point 914 in FIG. 9. The voltage at the cathode (circuit juncture 214), $V_C$, plateaus at about 12 Volts until the charge released begins to run out, thereby causing $V_C$ to fall from 12 Volts to 2 Volts towards the end of the period 904.

After the period 904, the regulating signal undergoes another period 906 of about 0.25 microseconds, which performs the holding step. The period 906 begins with a sharp spike 907 of about 5 Volts that lasts about the same time as the sharp dip 905. After the spike 907, the waveform rises linearly from about 2 Volts to 12 Volts and remains for about 0.0556 microseconds at 12 Volts before reaching a point where it is observed that there is a slight rise in voltage beyond 12 Volts. The slight rise continues on for about 0.111 microseconds. This slight rise would be responsible for about 1% increase in current and voltage at $V_C$ in the period 908 discussed later.

The effect of period 906 is that it activates the thyristor 231 to accumulate and hold charge at the gate (circuit juncture 217). $V_C$ remains at 2 Volts during the duration of period 906 as no charge is released to the cathode (circuit juncture 214).

After the period 906, the regulating signal undergoes another period 908 of about 0.4165 microseconds, which performs the releasing step, where the thyristor 231 is activated to conduct from the gate (circuit juncture 217) to the cathode (circuit juncture 214). The waveform of the releasing step in period 908 firstly falls generally linearly from 12 Volts to 2 Volts for about 0.0833 microseconds but at about midway, there is present a sharp fall 905 lasting about 0.0167 microseconds. Thereafter, the waveform remains at 2 Volts for about 0.278 microseconds followed by the same sharp spike 907 and a linear slope rising from 2 Volts to 35 Volts in about 0.0833 microseconds. The sudden increase to 35 Volts is a notable observation. The effect of period 908 is that the thyristor 231 releases all the charge accumulated at the gate (circuit juncture 217) during the period 906 to the cathode (circuit juncture 214). This causes the voltage at the cathode (circuit juncture 214), $V_C$, to slope linearly to about 12 Volts at point 912 in FIG. 9. There is a 1% increase in the current and voltage because of the slight rise beyond 12 Volts during the period 906. The voltage at the cathode (circuit juncture 214), $V_C$, plateaus at about 12 Volts until the charge released begins to run out, thereby causing $V_C$ to fall from 12 Volts to 2 Volts towards the end of the period 908.

After the period 908, the regulating signal undergoes another period 910 of about 0.15 microseconds, which performs the holding step. Basically, the regulating signal is held at 35 Volts during the period 910. During period 910, $V_C$ remains at 2 Volts.

After the holding step in period 910, the releasing step is performed again. In this instance, the regulating signal falls generally linearly from 35 Volts to 2 Volts for about 0.0833 microseconds but at about midway, there is present a sharp fall 905 lasting about 0.0167 microseconds. The effect of the releasing step at this instance is quite significant in that $V_C$ begins to rise from 2 Volts to 35 Volts at point 915 in FIG. 9. Thereafter, $V_C$ plateaus at about 35 Volts until the charge released begins to run out, thereby causing $V_C$ to fall from 35 Volts to 2 Volts.

The period 911 between the 1.25 microseconds mark and the 1.75 microseconds mark in FIG. 9 is then repeated to continue to cause $V_C$ to plateau at about 35 Volts, thereby maintaining a relatively stable DC Voltage output of about 35 Volts. It is submitted that within the order of microseconds, the releasing time i.e. the time where $V_C$ is kept at 35 Volts is about 6 times longer than the holding time i.e. the time $V_C$ is at 2 Volts, thus a high efficiency is obtained in the Voltage boosting.

It is appreciated that there are times where period 906 is required to be repeated before the significant boost of $V_C$ is achieved after period 910 can occur.

With regard to $V_G$, after the 1% increase at the time instance of point 914 in FIG. 9, the 1% increase will sustain until the 1.25 microsecond mark, thereafter voltage increases about linearly to 35 Volts at about the time when period 910 begins. Thereafter, $V_G$ remains at about 35 Volts.

Figure 3A:
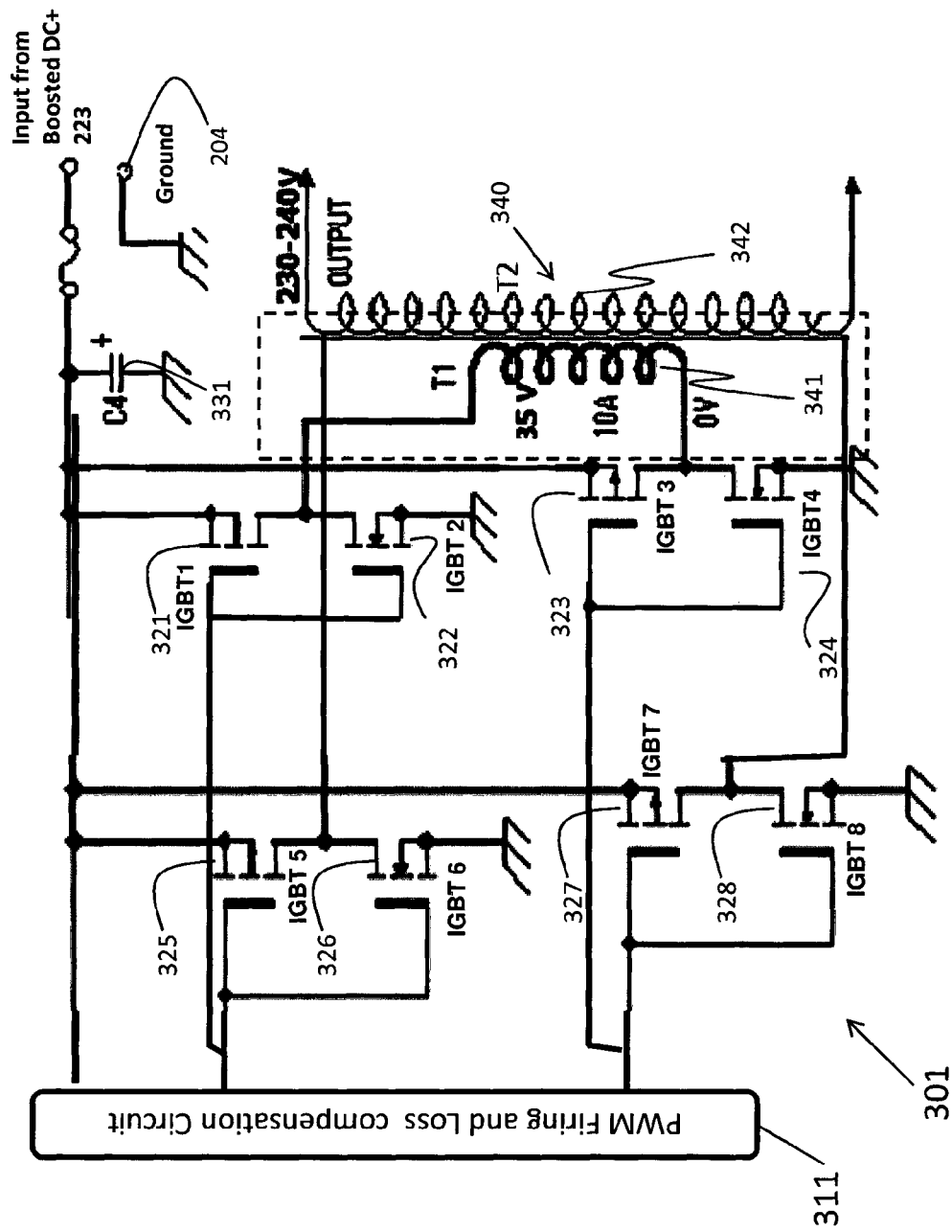
FIG. 3A is a circuit diagram of a DC to AC conversion process.

FIG. 3A is a circuit diagram of the DC to AC conversion subsystem 301 in FIG. 1. The DC to AC converter 301 comprises eight Insulated gate Bipolar Transistors ("IGBTs") 321, 322, 323, 324, 325, 326, 327 and 328. All the IGBTs described herein are of the same design. The cathodes of IGBT 321 and IGBT 323 are connected to the positive terminal 223 of the boosted DC voltage obtained from the DC to DC conversion subsystem 200. The positive terminal 223 at the terminal block 204 is also coupled to one end of a capacitor 331 and to a Pulse Width Modulation Firing and Loss compensation circuit 311. The other end of the capacitor 331 is connected to ground. It is noted that the words firing and triggering in relation to IGBTs are used interchangeably.

It is appreciated that the IGBTs as herein described may be replaced with filtering circuits in other examples.

The emitter ends of IGBT 321 and IGBT 323 are connected to two different ends of a primary winding 341 of a transformer 340. The emitter ends of IGBT 321 and IGBT 323 are also coupled to the cathodes of IGBT 322 and IGBT 324, respectively. The emitter ends of IGBT 322 and IGBT 324 are in turn connected to ground.

Similarly, the emitter ends of IGBT 325 and IGBT 327 are connected to two different ends of a secondary winding 342 of the transformer 340. The emitter ends of IGBT 325 and IGBT 327 are also coupled to the cathodes of IGBT 326 and IGBT 328, respectively. The emitter ends of IGBT 326 and IGBT 328 are in turn connected to ground.

Each of the gates of the IGBT 321, 322, 323, 324, 325, 326, 327 and 328 is coupled to the Pulse Width Modulation Firing and Loss compensation circuit 311. The Pulse Width Modulation Firing and Loss compensation circuit 311 provides the respective IGBT's triggering voltage, pulse timing and sequence for performing Pulse Wave Modulation (PWM). By measuring the voltages at the secondary winding 342 of the transformer 340 and by running an algorithm that determines modulation values of the output signal of the transformer 340 at the secondary winding 342 and/or and compares the modulation values against predefined desirable reference modulation values, the microcontroller 311 would adjust the triggering sequence to create an AC voltage waveform with the desired frequency (i.e. 230-240 Alternating Voltage Supply) at the output of the transformer 340 at the secondary winding 342. The microcontroller 311 also compares the voltages measured with predefined reference voltage values and relies on the comparison to adjust the triggering of the IGBTs. Modulation values refer to peak to peak voltage values of a voltage signal. In this case, the triggering or firing sequence of the IGBTs 321, 322, 323, 324, 325, 326, 327 and 328 are looped continuously in order i.e. 321, followed by 322, followed by 323, followed by 324, followed by 325, followed by 326, followed by 327, followed by 328, back to 321 and so on.

There are losses after every firing of each of the eight IGBTs 321, 322, 323, 324, 325, 326, 327 and 328. The Pulse Width Modulation Firing and Loss compensation 311 helps to reduce those losses by monitoring every firing and providing the required compensation to ensure that the DC to AC conversion process is efficient.

Figure 3B:
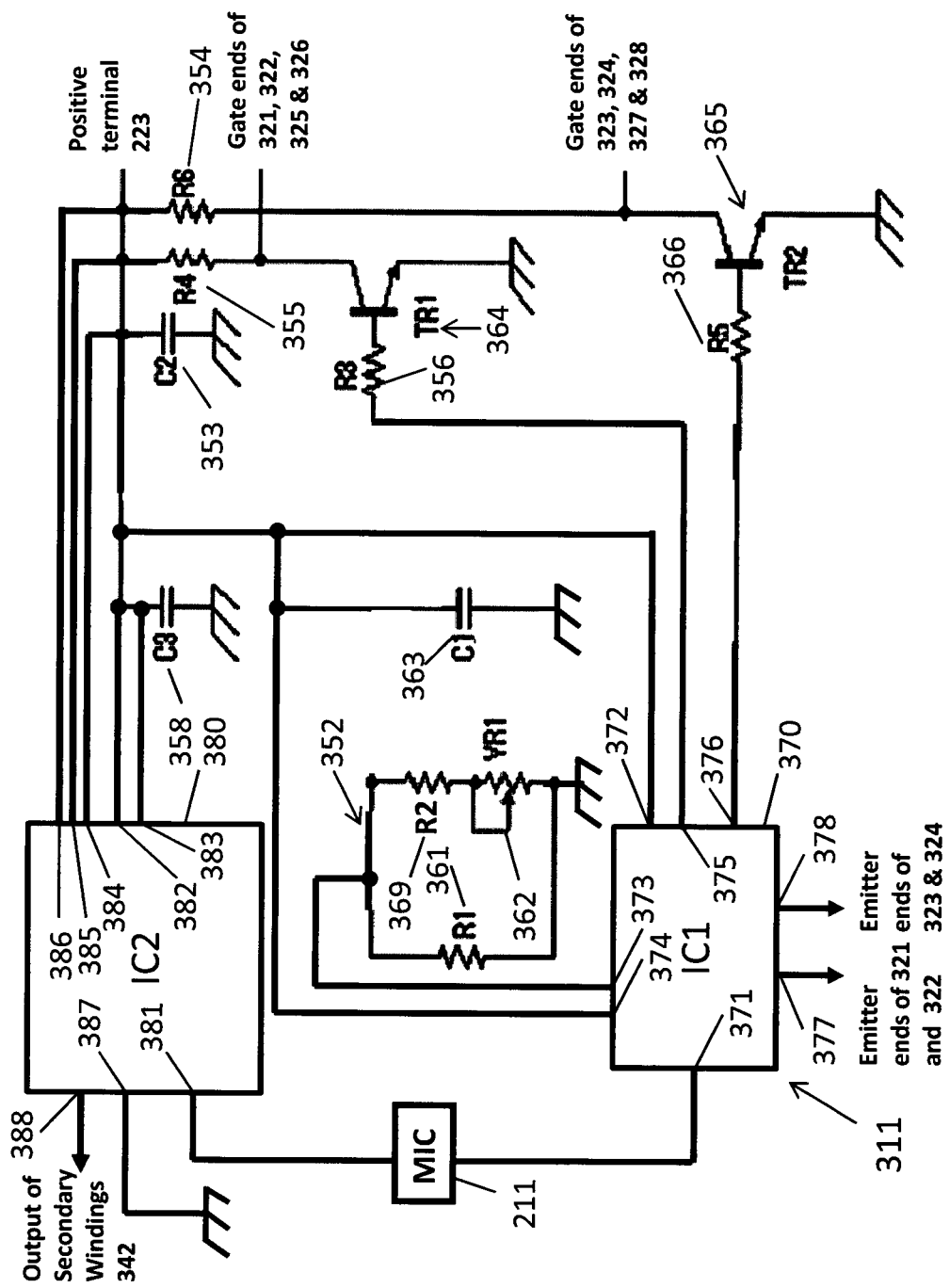
FIG. 3B is a circuit diagram of a microcontroller circuit of the DC to AC conversion process.

FIG. 3B is a circuit diagram of the Pulse Width Modulation (PWM) Firing and Loss compensation circuit 311 in FIG. 3A.

The PWM Firing and Loss compensation circuit 311 comprises two integrated circuits IC1 370 and IC2 380. Each of IC1 370 and IC2 380 has eight pins. IC1 370 and IC2 380 are connected to the microcontroller 211 via pins 371 and 381 respectively. IC1 370 and IC2 380 receive commands via pins 371 and 381 respectively from the microcontroller 211 to carry energy compensation and to control the firing of the eight IGBTs 321, 322, 323, 324, 325, 326, 327 and 328. Apparently, firing of the IGBTs 321, 322, 323, 324, 325, 326, 327 and 328 takes place in conjunction with the compensation of energy losses due to the firing.

Power is supplied to both IC1 370 and IC2 380 via pins 372 and 382 respectively from the positive terminal 223, which has a boosted DC output from the DC Voltage booster 202. Some circuitries (not shown in FIG. 3B) may be connected to the positive terminal 223 and the microcontroller 211 to ensure that IC1 370 and IC2 380 receive the desired power supply required to operate.

The emitter ends of the IGBTs 321 and 322, which are connected to each other, are monitored by pin 377 of IC1 370. IC1 370 monitors the resistance values calculated at the emitter ends of the IGBTs 321 and 322 as well as the current values. Similarly, the emitter ends of the IGBTs 323 and 324, which are connected to each other, are monitored by pin 378 of IC1 370. IC1 370 monitors the resistance values calculated at the emitter ends of the IGBTs 321, 322, 323 and 324 as well as the current values at those emitter ends. The monitored current and resistance values are saved into a memory of the microcontroller 211 or the IC1 370, where necessary, for comparison with predefined desired reference resistance and current values. Whenever there is a difference between the desired reference resistance and current values and the actual resistance and current values monitored by pins 377 or 378, the microcontroller 211 would send commands to instruct IC1 370 to make compensation or, alternatively, IC1 370 is configured to automatically carry out the necessary compensation. The memory may be Read Only Memory (ROM), Random Access Memory (RAM), flash memory, a magnetic disk and the like.

A pin 373 of the IC1 370 is connected to a circuit loop 352 comprising a resistor R1 361, a second resistor R2 369 and a variable resistor VR1 362. R2 369 is connected in series with VR1 362 and R1 361 is connected in parallel with R2 369 and VR1 362. The variable resistor VR1 362 is adjustable by the microcontroller 211 to compensate for any difference between the calculated resistance value monitored at pin 377 or 378 and a predefined desired reference resistance value made available to the microcontroller 211 or IC1 370 for comparison.

A pin 374 of the IC1 370 is connected to one end of a capacitor C1 363, which is controlled by IC1 370 during operation. The same end of C1 363 is also connected to the positive terminal 223. The other end of C1 363 is connected to ground. C1 363 is used to provide charge to compensate current when the current value detected by pin 373 is lower than a predefined desired reference current value made available to the microcontroller 211 or IC1 370 for comparison. C1 363 is charged whenever possible by the boosted DC voltage at the positive terminal 223.

A pin 375 of the IC1 370 is connected to a resistor R3 356. A base end of an NPN transistor TR1 364 is connected in series with the resistor R3 356. A emitter end of the transistor TR1 364 is connected to ground and A collector end of the transistor TR1 364 is connected to the gates of the IGBTs 321, 322, 325 and 326. A resistor R4 355 is in turn connected at one end to the gates of the IGBTs 321, 322, 325 and 326 and at another end to the positive terminal 223.

The resistor R3 356 is used to further refine the resistance value monitored by pin 377 that is compared with the predefined desired reference resistance value made available to the microcontroller 211. The further refinement provided by R5 356 compensates for energy losses incurred by circuit loop 352 and by capacitor 363 when they are utilised to compensate for energy losses due to firing of IGBTs 321 and 322.

A pin 376 of the IC1 370 is connected to a resistor R5 366. A base end of an NPN transistor TR2 365 is connected in series with the resistor R5 366. An emitter end of the transistor TR1 364 is connected to ground and a collector end of the transistor TR1 364 is connected to the gates of the IGBTs 323, 324, 327 and 328. A resistor R6 354 is in turn connected at one end to the gates of the IGBTs 323, 324, 327 and 328 and at another end to the positive terminal 223.

The resistor R5 366 is used to further refine the resistance value monitored by pin 378 that is compared with the predefined desired reference resistance value made available to the microcontroller 211. The further refinement provided by R5 366 compensates for energy losses incurred by circuit loop 352 and by capacitor 363 when they are utilised to compensate for energy losses due to firing of IGBTs 323 and 324.

Both transistors TR1 364 and TR2 365 are used for overcurrent protection at their respective points in the circuit, in particular, for protecting against overcurrent caused by the boosted DC Voltage at the positive terminal 223.

A pin 388 of the IC2 380 is connected to the output of the secondary windings 342. Pin 388 is used for monitoring the voltage values calculated at the output of the secondary windings 342. The monitored voltage values are saved into a memory of the microcontroller 211 or the IC2 380, where necessary, for comparison with predefined desired reference voltage values. Whenever there is a difference between the desired reference voltage values and the actual voltage values monitored at the output of the secondary windings 342, the microcontroller 211 would send commands to instruct IC2 380 to make compensation or, alternatively, IC2 380 is configured to automatically carry out the necessary compensation. The memory may be Read Only Memory (ROM), Random Access Memory (RAM), flash memory, a magnetic disk and the like.

A pin 383 of the IC2 380 is connected to one end of a capacitor C3 358, which is controlled by IC1 380 during operation. The same end of C3 358 is also connected to the positive terminal 223. The other end of C3 358 is connected to ground. C3 358 is used to provide charge to compensate current when the voltage value detected by pin 388 is lower than a predefined desired reference voltage value made available to the microcontroller 211 or IC2 380 for comparison. C3 358 is charged whenever possible by the boosted DC voltage at the positive terminal 223.

Similarly, a pin 384 of the IC2 380 is connected to one end of a capacitor C2 353, which is controlled by IC1 380 during operation. The same end of C2 353 is also connected to the positive terminal 223. The other end of C2 353 is connected to ground. C2 353 is used to provide charge to compensate current when the voltage value detected by pin 388 is lower than the predefined desired reference voltage value made available to the microcontroller 211 or IC2 380 for comparison. C2 353 is charged whenever possible by the boosted DC voltage at the positive terminal 223.

IC2 380 comprises another pin 385 that is connected to one end of a resistor R4 355. The other end of R4 355 is connected to the gates of IGBTs 321, 322, 325 and 326. R4 355 compensates for losses due to firing of IGBTs 325 and 324 based on differences between voltage values detected by pin 388 and the predefined desired reference voltage value made available to the microcontroller 211 or IC2 380 for comparison.

Similarly, IC2 380 comprises a further pin 386 that is connected to one end of a resistor R6 354. The other end of R6 354 is connected to the gates of IGBTs 323, 324, 327 and 328. R6 354 compensates for losses due to firing of IGBTs 327 and 328 based on differences between voltage values detected by pin 388 and the predefined desired reference voltage value made available to the microcontroller 211 or IC2 380 for comparison.

In the present example, C2 353, C3 358, R4 355 and R6 354 are connected in parallel to one another. Furthermore, a pin 387 of IC2 380 is connected to ground to provide for any grounding needs required by IC2 380.

Figure 7:
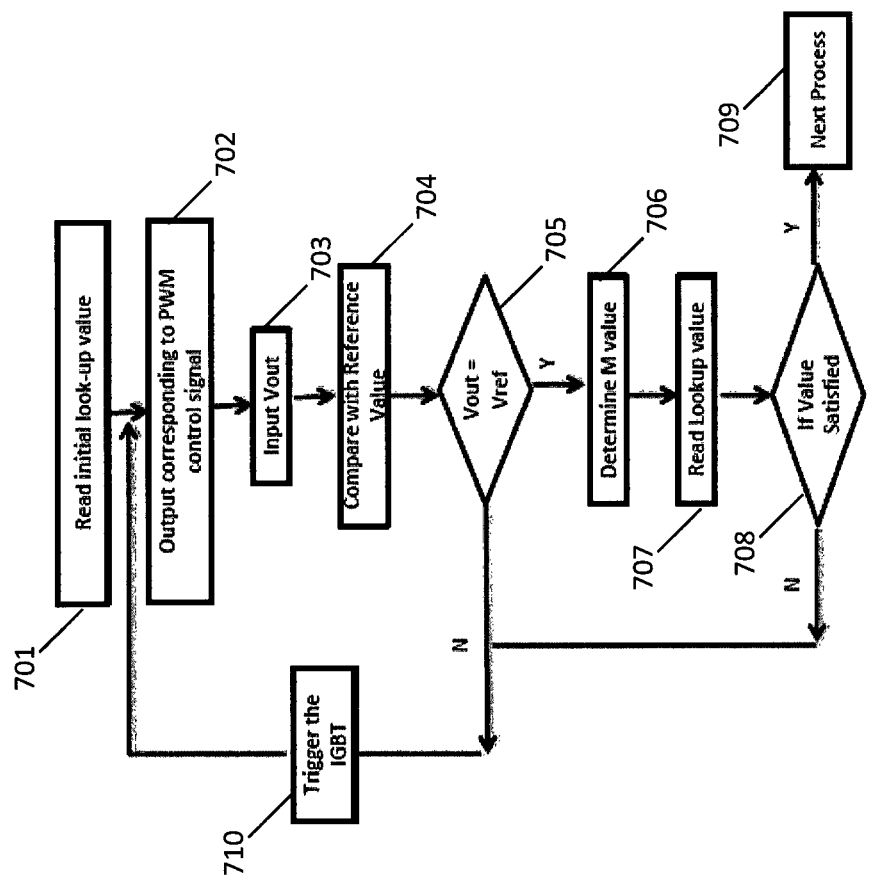
FIG. 7 shows a flowchart illustrating steps taken at the DC to AC Conversion process.

Details of the method steps applied by the microcontroller 211, IC1 370 and/or IC2 380 are described as follows with reference to FIG. 7. Reference is made to components in FIGS. 3A and 3B.

In the present example, the DC voltage signal, 35 Volts, received from the positive terminal 223 of the terminal block 204 changes into an AC signal after the fourth IGBT i.e. 324 is triggered. The operation process for triggering or firing the eight IGBTs 321, 322, 323, 324, 325, 326, 327 and 328 loops until a condition is satisfied. The condition is that a Vout value indicative of the output signal obtained at the secondary winding 342 of the transformer 340 becomes equal to a Vref value that is a predefined desirable reference voltage value (also known as the initial look-up voltage value) made available to the microcontroller 211 for comparison with Vout. Vout is a value that would be changing according to the triggering of the IGBTs. Vref is selected based on the desired AC output requirements of the DC to AC power enhancer system 100 in FIG. 1, for example, Vref could be 110-120 or 230-240 Volts (root mean square) (i.e. Vrms).

At step 701, the microcontroller 211 reads or retrieves the initial look-up voltage value, Vref from a memory. The memory may reside in the microcontroller 211, the IC1 370 or IC2 380 or externally connected to the microcontroller 211, the IC1 370 or IC2 380. The memory may be Read Only Memory (ROM), Random Access Memory (RAM), flash memory, a magnetic disk and the like.

After step 701, the microcontroller 211 checks the Pulse Width Modulation (PWM) control signal at the secondary winding 342 at step 702. The step of checking the PWM control signal is for determining the Vout value, which is a Voltage reading extracted at a specific time instance of the PWM control signal. The PWM control signal is detected via pin 388 of IC1 380. Vout is a value that may vary according to the triggering of the IGBTs.

After step 702, the Vout value is obtained from the PWM control signal and inputted to the microcontroller 211 via IC2 380 at step 703.

Upon receiving the value of Vout at step 703, the microcontroller 211 compares the value of Vout with the predefined desirable reference voltage value, Vref, at step 704.

Step 705 performs the comparison carried out by the microcontroller 211 at step 704. The microcontroller 311 checks at step 705 whether Vout is equaled to Vref.

If Vout equals to Vref at step 705, the microcontroller 211 determines an M value i.e. a modulation value for the value of Vout at step 706. The M value refers to the peak to peak values of the PWM control signal. For example, if Vout is initially 35 Volts (DC) before the firing of the IGBTs, the modulation value of the Vout value is also 35 Volts, which is the peak to peak voltage of the 35 Volts (DC). After firing the IGBTs and acquiring an AC voltage signal, the M value changes according to the peak to peak voltage of the AC voltage signal acquired. In this example, ultimately, the desirable output AC voltage signal to be acquired is a sinusoidal signal having a root mean square voltage, Vrms, of 230-240 or 110-120. It is appreciated that Vrms equals to Vpeak divided by square root of 2, where Vpeak is half of the peak to peak voltage of the AC voltage signal.

If Vout is not equaled to Vref at step 705, the microcontroller 211 would at step 710 trigger all the eight IGBTs 321, 322, 323, 324, 325, 326, 327 and 328 in that sequence, followed by proceeding to step 702 again. Steps 702, 703, 704 and 705 would loop until the triggering of the eight IGBTs have caused Vout to be equaled to Vref. It is appreciated that the microcontroller 211 may trigger one or more of the eight IGBTs in any sequence if it is preferred to ensure that Vout equals to Vref.

After step 706, the microcontroller 211 reads or retrieves a look-up modulation value from a memory at step 707. The look-up modulation value is a predefined desirable reference modulation value made available to the microcontroller 211 for comparison with the M value determined at step 706. The look-up modulation value is selected based on the desired AC output requirements of the DC to AC power enhancer system 100 in FIG. 1. The memory may reside in the microcontroller 211, the IC1 370 or IC2 380 or externally connected to the microcontroller 211, the IC1 370 or IC2 380. The memory may be Read Only Memory (ROM), Random Access Memory (RAM), flash memory, a magnetic disk and the like.

After reading or retrieving the look-up modulation value at step 707, the microcontroller 311 checks whether the M value determined at step 706 equals to the look-up modulation value at step 708.

If during step 708, the M value determined at step 706 equals to the look-up modulation value read at step 707, this would mean that the M value (i.e. peak to peak voltage value) of the output AC waveform at the secondary windings 342 of the DC to AC converter 301 has fulfilled the desired modulation value requirements. As such, nothing further needs to be done and the process ends at step 709. The next process i.e. AC power boosting carried out by the AC power booster 401 in FIG. 1 may then commence.

However, if during step 708, the M value determined at step 706 is not equaled to the look-up modulation value read at step 707, the microcontroller 211 would at step 710 trigger all the eight IGBTs 321, 322, 323, 324, 325, 326, 327 and 328 in that sequence, followed by proceeding to step 702 again. Steps 702 onwards until 708 would loop till the triggering of the IGBT(s) have caused the M value determined at step 706 to be equaled to the look-up modulation value read at step 707.

Steps 706 to 708 are additional steps included to ensure that the desired AC output requirements could be obtained at the second winding 342 of the transformer 340. The desired AC output requirements could already be obtained through steps 702 to 705.

It is appreciated that for the stage of DC to AC conversion, depending upon the power capacity of the circuit i.e. how much power the circuit is to provide, lesser number of IGBTs may be used. It is appreciated that the number of IGBTs that could be used may range between 2 to 8.

Figure 11:
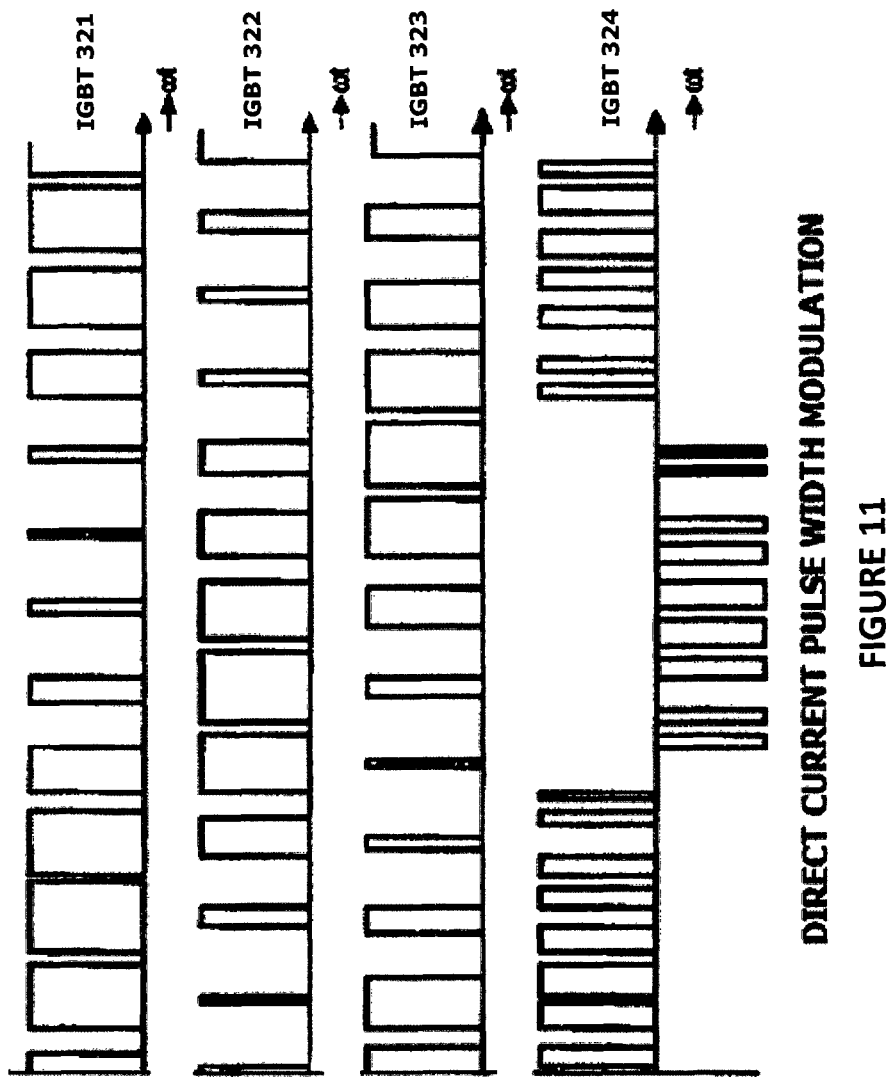
FIG. 11 illustrates waveforms produced after triggering Insulated gate Bipolar Transistors.
Figure 12:
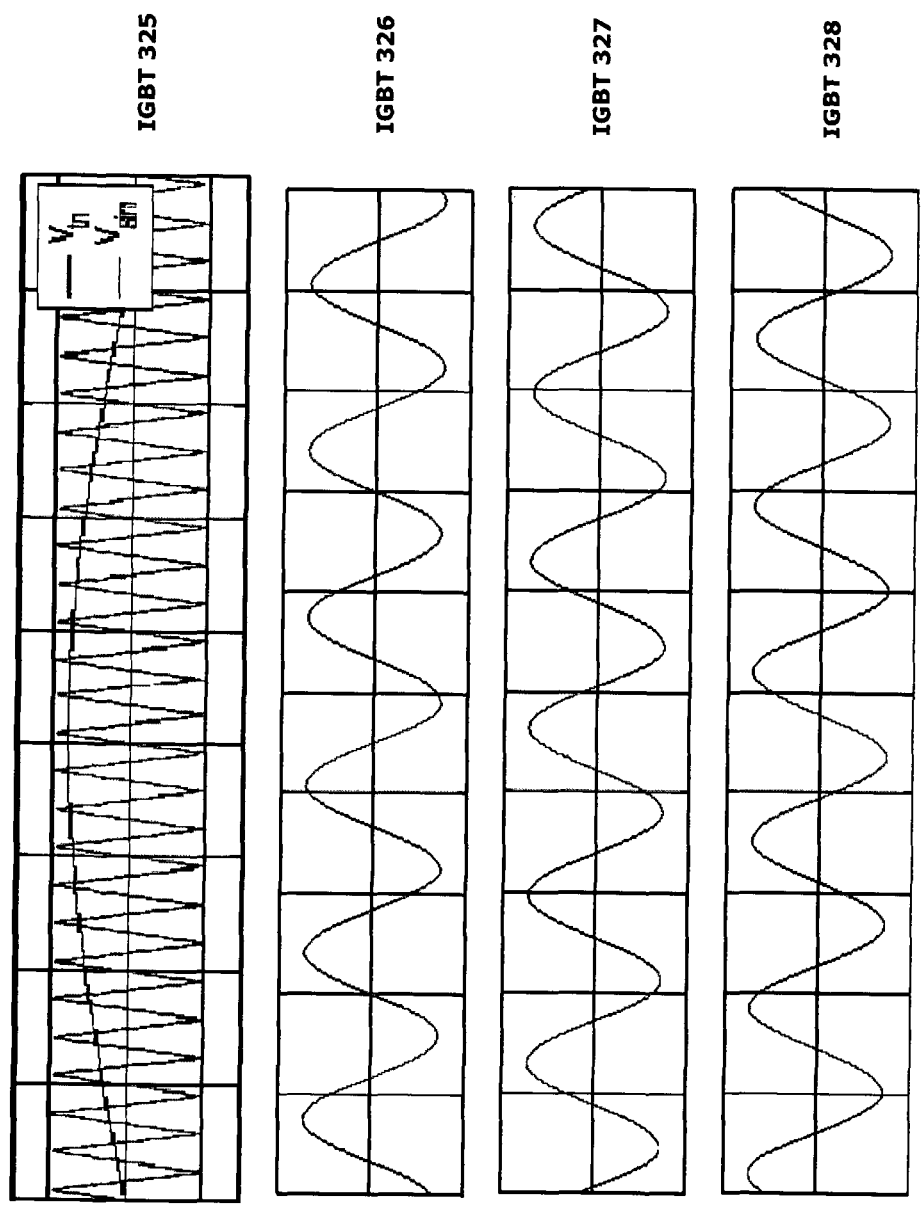
FIG. 12 illustrates waveforms produced after triggering Insulated gate Bipolar Transistors.

FIGS. 11 and 12 together illustrate possible PWM control signals (voltage vs time format) obtained after the firing of each of the eight IGBTs 321, 322, 323, 324, 325, 326, 327 and 328 in that sequence. In the case of the firing results in FIGS. 11 and 12, the PWM control signal of IGBT 328 is the desired AC output. In FIG. 11, the PWM control signals obtained by the first four IGBTs 321, 322, 323 and 324 are still DC signals. In FIG. 12, the PWM control signals obtained by the last four IGBTs 325, 326, 327 and 328 after the firing of the first four IGBTs 321, 322, 323 and 324 are AC signals.

FIG. 4 shows a circuit diagram of the AC power booster 401 in FIG. 1. The AC power booster 401 comprises two thyristors 431 and 432, two resistors 422 and 423, a diode 424 and a connected load 420. It is appreciated that the resistors 422 and 423 could be made up of one or more variable or non-variable resistors. The thyristor 431 could be a silicon controlled rectifier thyristor or any other similar thyristor. There are various circuit junctures 411, 434, 436 and 438 having connections to the microcontroller 211 described with reference to previous Figures. The gate of the thyristor 431 is connected to the circuit juncture 438. The anode of the thyristor 431 is connected to the circuit juncture 411. The cathode of the thyristor 431 is connected to the circuit juncture 434. One end B0 410 of the secondary winding 342 of the transformer 340 in FIG. 3A is connected to the circuit juncture 411 and the other end B1 412 of the secondary winding 342 of the transformer 340 is connected to the circuit juncture 436. Circuit juncture 434 is connected to circuit juncture 436. The resistor 423 is connected in series with the diode 424. The diode anode of the diode 424 is connected to the resistor 423 and the diode cathode of the diode 424 is connected to circuit juncture 438. The resistor 422 is connected between circuit junctures 411 and 436. The anode of the thyristor 432 is connected to the circuit juncture 434 and the gate and cathode of the thyristor 432 are each connected to the load 420 to drive the load 420 with the AC signal enhanced by the AC power booster 401. Voltage at the cathode of the thyristor 431 is enhanced. Current is led to the anode of the thyristor 432 from the cathode of the thyristor 431 to apply the enhanced voltage to the anode of the thyristor 432.

At circuit juncture 411, 3 pins of the microcontroller 211, namely 'R' for regulating, 'C' for comparator and 'M' for monitoring are connected to corresponding circuit points 413, 414 and 415 respectively. Circuit point 413 is in turn connected to B0 410. Circuit point 414 is connected to the resistor 422 and circuit point 415 is connected to the anode of the thyristor 431.

At circuit juncture 411, the 'R' pin connected to circuit point 413 helps to regulate current flow between circuit points 413, 414 and 415. That is, it helps to conduct current flow between circuit points 413 and 414 through the microcontroller 211, and current flow between circuit points 413 and 415 through the microcontroller 211 when necessary. The 'C' pin connected to circuit point 414 enables comparison between the Resistance value [at circuit point 415 and the voltage value monitored by the 'M' pin connected to point 416. If the voltage value at point 415 is lesser than the voltage value at point 416, current flow between circuit points 413 and 414 would occur. Otherwise, current flow between circuit points 413 and 415 would carry out. The 'M' pin connected to circuit point 415 monitors the voltage value of point 415 and stores it in a cache memory of the microcontroller 211 for comparison by the 'C' pin.

At circuit juncture 436, 3 pins of the microcontroller 211, namely for regulating, 'C' for comparator and 'M' for monitoring are connected to corresponding circuit points 403, 402 and 404 respectively. Circuit point 403 is in turn connected to B1 412. Circuit point 402 is connected to the resistor 422 and circuit point 404 is connected to the resistor 423.

At circuit juncture 436, the 'C' pin connected to point 402 enables comparison between a first resistance value calculated based on current and voltage at point 402 and a first predefined resistance value. The 'R' pin connected to point 403 is enabled to allow current to flow from the point 402 to point 404 through the microcontroller 211 if the first resistance value is lesser than the first predefined resistance value. Otherwise, the 'R' pin connected to point 403 is enabled to allow current to flow between the points 403 and 402 through the microcontroller 211. The 'M' pin 404 outputs current associated with the first resistance value calculated at point 402 if the first resistance value is lesser than the first predefined resistance value. It is appreciated that the first predefined resistance value is selected accordingly to contribute towards voltage enhancement at the cathode of thyristor 431.

At circuit juncture 434, 3 pins of the microcontroller 211, namely 'R' for regulating, 'C' for comparator and 'M' for monitoring are connected as follows. The 'R' and 'M' pins are connected to circuit point 416. The 'C' pin is connected to circuit point 417. Circuit point 416 is in turn connected to the cathode of the thyristor 431. Circuit point 417 is connected to a circuit point 418. Circuit point 418 is in turn connected to circuit point 403 and B1 412.

At circuit point 434, the 'C' pin connected to point 417 reacts based on a comparison between a second resistance value calculated based on current and voltage monitored at point 416 (by the 'M' pin connected to point 416) and a second predefined resistance value. Current always flow between the cathode of the thyristor 431 and the anode of the thyristor 432. However, if the second resistance value calculated is lesser than the second predefined resistance value, the 'R' pin connected to point 416 is enabled to allow current to flow between the points 416 and 417 through the microcontroller 211. The 'M' pin connected to point 416 monitors the current and voltage at point 416 and saves their values in a memory for the calculation of the second resistance value. It is appreciated that the second predefined resistance value is selected accordingly to contribute towards voltage enhancement at the cathode of the thyristor 431.

Circuit points 418 and 403 are connected to 2 pins, namely a 'M' (Monitoring) pin and an 'R' (Regulating) pin respectively, of the microcontroller 211.

The 'M' pin connected to point 418 monitors the current and voltage at point 418 for calculation of a third resistance value at point 418. The 'R' pin connected to points 403 and 418 enables current flow between points 403 and 418 when the third resistance value is greater than a third predefined resistance value. It is appreciated that the third predefined resistance value is selected accordingly to contribute towards voltage enhancement at the cathode of the thyristor 431.

Each of the first, second and third predefined resistance values may vary depending on the power capacity of AC power booster 401 and range from 1 to 100 ohms. For example, for the AC power booster 401 to provide a power supply capacity of 1200 Watts, each of the first, second, and third predefined resistance values may be about 10 ohms.

At circuit juncture 438, 4 pins of the microcontroller 211, namely 'M' for monitoring, 'REL' for release, 'H' for hold and 'R' for regulating are all connected to one circuit point 405. Circuit point 405 is connected to the diode cathode end of the diode 424 and the gate of the thyristor 431.

At circuit juncture 438, the 'R' pin connected to point 405 is configured to transmit regulating signals to activate the thyristor 431 for current flow between its anode and cathode and between its gate and cathode.

The 'M' pin connected to point 405 is configured for monitoring the voltage and current values at circuit point 405.

The 'H' pin connected to point 405 is configured to enable accumulation of charge at the gate (i.e. circuit juncture 438) of the thyristor 431. The 'H' pin connected to point 405 may transmit a hold signal, which in the present example could be a fixed 5 Volts signal, to work in conjunction with the regulating signal of the 'R' pin connected to point 405 to activate the thyristor 431 in order of microseconds, e.g. including 0.001 to 2 microseconds, to conduct current from the anode of the thyristor 431 to the gate so that a resistance value calculated based on current and voltage monitored at the anode, $R_A$, would become similar to a resistance value calculated based on current and voltage monitored at the gate, $R_G$, of the thyristor 431 for a first time range. During the period of the hold signal, the voltage at the cathode, $V_C$, of thyristor 431 would not be enhanced.

The 'REL' pin is configured to enable releasing of accumulated charge at the gate of the thyristor 431 when the thyristor 431 has been activated to conduct current from the gate of the thyristor 431 to the cathode of the thyristor 431. The 'REL' pin may transmit a release signal, which in the present example could be a fixed 2 Volts signal, to work in conjunction with the regulating signal of the 'R' pin to activate the thyristor 431 in order of microseconds, e.g. including 0.001 to 2 microseconds, to conduct current from the gate of the thyristor 431 to the cathode of the thyristor 431 so that the resistance value calculated based on current and voltage monitored at the gate, $R_G$, would become similar to the resistance value calculated based on current and voltage monitored at the cathode, $R_C$, of the thyristor 431 for a second time range. During the period of the release signal, $R_C$ would rise up initially and follow the value of $R_G$ for a while before falling. During the period of the release signal, the voltage at the cathode, $V_C$, would be enhanced to provide sufficient power output or drive to support the load 420.

From observation, the second time range where $R_G$ is similar to $R_C$ is longer than the first time range where $R_A$ is similar to $R_G$. The longer it is, the better is the voltage enhancement at the cathode of the thyristor 431.

In total, 15 pins of the microcontroller 211 are utilised at all 4 circuit junctures, 411, 434, 436 and 438 and each pin is different from the other in this example. It is possible that one pin may be used at more than one circuit point by adjusting the algorithm run by the microcontroller 211.

With regard to circuit juncture 411, the 'M' pin (connected to point 415) is configured for outputting signal from the 'R' pin (connected to point 413) or the 'C' pin (connected to point 414) to the anode of the thyristor 431 at the appropriate time. Similarly, the 'M' pin connected to point 403 at the circuit juncture 436 is configured for outputting signal from the 'R' pin (connected to point 403) or the 'C' pin (connected to point 402) at the appropriate time.

When the Alternating Current is flowing through the AC power booster 401, current flow splits into two paths at circuit juncture 411. A first path leads to the anode of the thyristor 431 and a second path leads to the resistors 422 and 423, and the diode 424. The resistors 422 and 423 help to refine resistance value to achieve the desired power output for the load 420. It is appreciated that power is a function of voltage, current and resistance. Adjusting resistance helps to adjust power as well.

By using the similar method employed at the thyristor 231 of the DC voltage booster 202 in FIGS. 2A and 2B, current can be refined to enhance the power output at the cathode of the thyristor 431. In more detail, the diode 424 directs current flow in the second path towards the gate of the thyristor 431. By sending from the microcontroller 211, an appropriate regulating signal from the 'R' pin in conjunction with signals from the 'H' or 'REL' pins connected to point 405, the thyristor 431 can be activated to allow current flow between the anode and the gate in a first instance (i.e. the holding step). By sending from the microcontroller 211, another appropriate regulating signal from the 'R' pin in conjunction with signals from the 'H' or 'REL' pins connected to point 405, the thyristor 431 can be activated to allow current flow between the gate and the cathode in a second instance (i.e. the releasing step). As a result, current and therefore voltage enhancement is provided at the cathode and the enhanced voltage at the cathode is an enhancement of the voltage at the anode. With the refined current and resistance values obtained at the cathode of the thyristor 431, a desired AC output signal with enhanced power output is also obtained at the cathode of the thyristor 431. The desired AC output signal is then passed to the other thyristor 432, which is operating as a normal thyristor and in turn sent to the load 420.

The resistance or current values are being monitored at the various monitoring points e.g. at points 405 and 416. The time difference between the first instance and the second instance indicates a holding time. If during the holding time, the resistance or current values monitored at the various monitoring points e.g. at points 405 and 416 are insufficient for providing the desired power output after comparing them with predefined desirable reference resistance or current values made available to the microcontroller 211, the holding time is delayed to hold more charge at the gate. The delay however should not be too long until the charge collected at the gate of the thyristor 431 causes thyristor 431 to reach its limit i.e. breakdown voltage at the gate.

Figure 8:
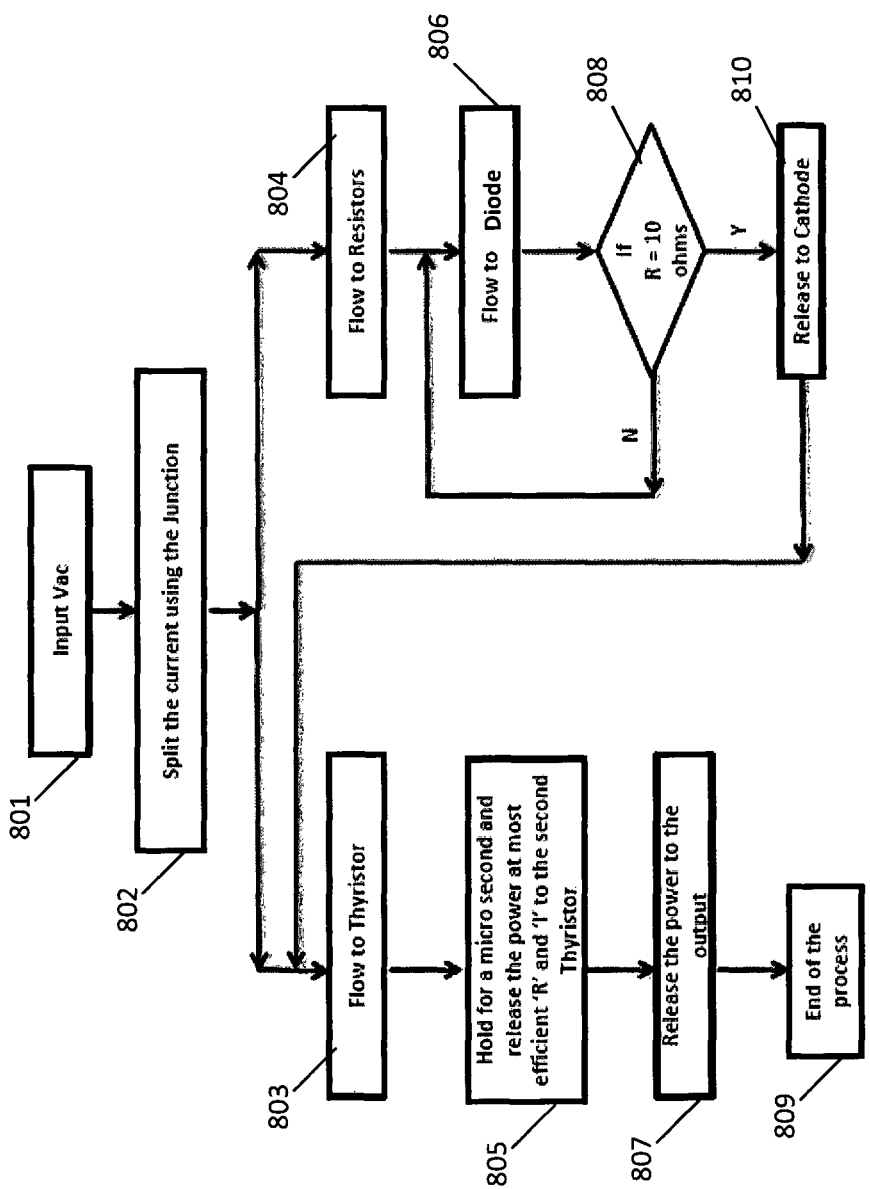
FIG. 8 shows a flowchart illustrating steps taken at the AC power booster.

Details of the AC boosting process carried out by the AC power booster 401 are described as follows with reference to FIG. 8. Reference is made to components in FIG. 4.

At step 801, AC signal from the secondary winding 342 of the transformer 340 in FIG. 3A is received at circuit juncture 411. More specifically, the AC signal is received by the 'R' pin connected to point 413. The input voltage of the AC signal is referred to as Vac.

Thereafter, at step 802, the AC signal is split into the two paths mentioned earlier at circuit juncture 411, the first path leading towards the thyristor 431, and the second path leading towards the resistors 422 and 423.

At step 804, the AC signal that is split at step 802 is flowing to the resistors 422 and 423. With current under control, resistance can be adjusted to affect power. Hence, the purpose of resistors 422 and 423 is to help to adjust, in this case to gain, resistance and in the process increase or maintain the desired power required.

Subsequently, the current flowing to the resistors 422 and 423 at step 804 would flow to the diode 424 at step 806.

After flowing to the diode 424 at step 806, the microcontroller 411 checks at step 808 whether a calculated resistance value, R, of the incoming AC signal is at a predefined reference resistance value made available to the microcontroller 211, which in this case is selected to be 10 ohms. It has been discovered that 10 ohms is useful for the present example.

It is appreciated that the predefined reference resistance value can be selected from a range of up to 200 Ohms in the present example.

The R value is calculated from the voltage and current values obtained from the 'M' pins connected to points 415, 416 and 404. The I value is obtained from the 'M' pins connected to points 415, 416 and 404.

If the resistance value calculated from voltage and current values read via the 'M' pin connected to point 404 of the microcontroller 211 is 10 ohms at step 808, the microcontroller 211 would activate the thyristor 431 to allow current flow between the gate and the cathode of the thyristor 431 at step 810, followed by proceeding with step 803.

At step 803, the AC signal that is split at step 802 is flowing is flowing to the thyristor 431.

At step 805, the thyristor 431 is activated by the microcontroller to allow current flow between the anode and the gate of the thyristor 431 in a first instance and between the gate and cathode of the thyristor 431 in a second instance. The holding time between the first and second instances is delayed by, for example, a microsecond, before the enhanced power in the charge at the gate of the thyristor is released at the most efficient resistance value, R, and current value, I, to the cathode of the thyristor 431.

The most efficient R and I values are the predefined desirable reference resistance or current values made available to the microcontroller 211 for comparison with the calculated R value and its corresponding I value obtained from the 'M' pins connected to points 415, 416 and 404.

The 'C' pins connected to points 414, 402 and 417 are put into use to direct current flow accordingly in both cases when the R and I values have reached the most efficient R and I values or when the R and I values have not reached the most efficient R and I values.

At step 807, the enhanced power output acquired at step 805 is directed to the second thyristor 423 via control of the microcontroller 211 at circuit juncture 434. The enhanced power output is then directed to drive the load 420 from the second thyristor 423.

After step 807, the process of AC power boosting carried out by the AC power booster 401 ends.

Figure 10:
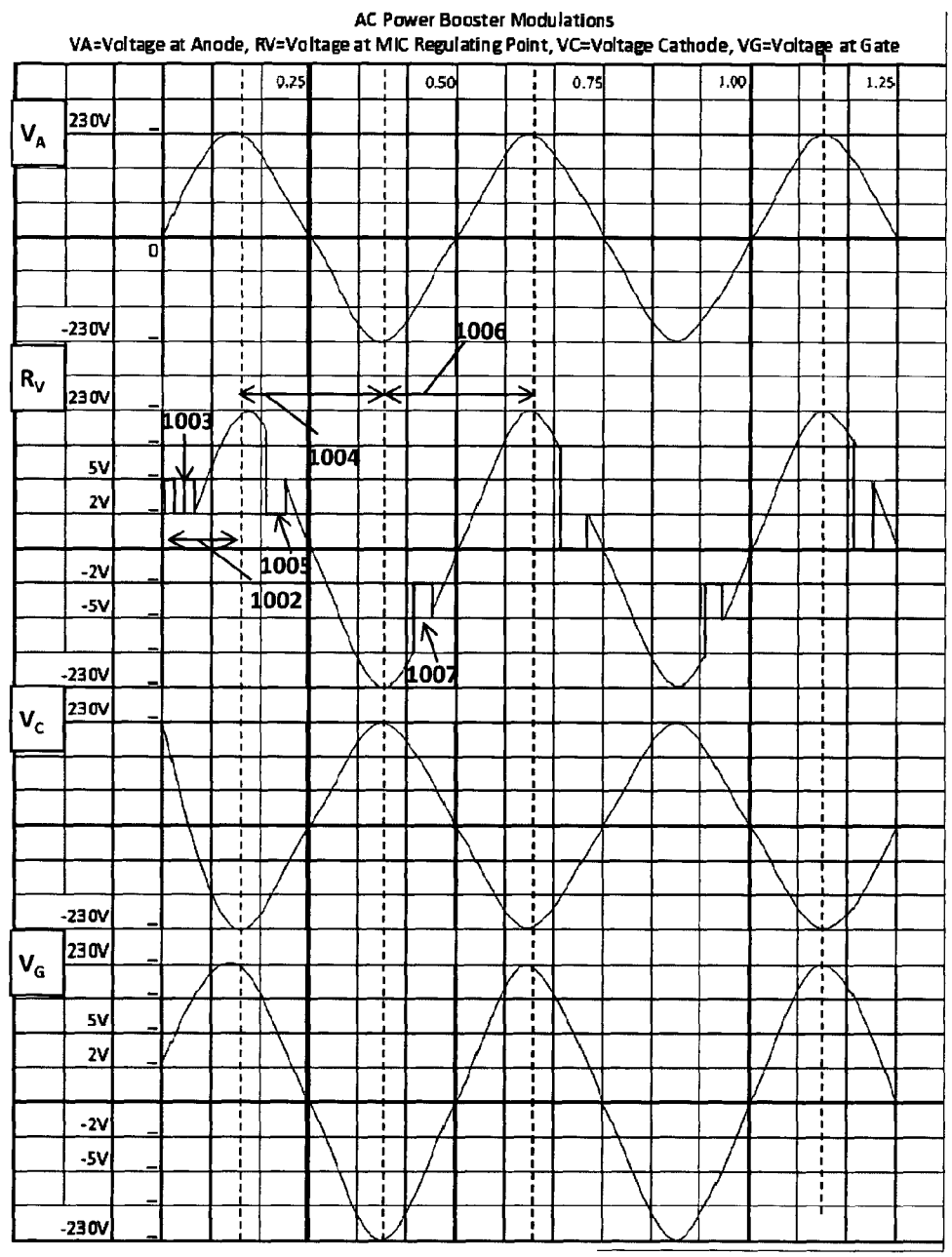
FIG. 10 is a chart illustrating voltage profiles at specific points in the AC power booster.

FIG. 10 illustrates an example of AC power boosting conducted at the AC power booster 401. In particular, the holding step occurring in a first instance and the releasing step occurring in a second instance are illustrated. The results are obtained from observations. It is noted that although specific timings in order of microseconds, e.g. including 0.001 to 2 microseconds, are provided, they are to be regarded as estimates only and they pertain to one commercially available standard Silicon-Controlled Rectifier (SCR) thyristor. The timings may change depending on the constitution and design of the thyristor being used. It is possible to have timings longer or shorter to an extent that voltage at the cathode of the thyristor is enhanced as desired.

With reference to FIG. 4, it is assumed in FIG. 10 that the reading at the voltage of the anode (circuit juncture 411) of the thyristor 431, $V_A$, is a sinusoidal AC voltage signal with 230-240 (i.e. root mean square voltage). The aim is to enhance the AC voltage signal at the cathode (circuit juncture 434) of the thyristor 431, $V_C$, to achieve an enhanced power output of 230-240 Vrms. In the present case, the voltage of the gate (circuit juncture 438), $V_G$, follows exactly that of the voltage of the anode (circuit juncture 411), $V_A$. The voltage at the cathode (circuit juncture 434), $V_C$, is about 180 degrees out of phase with the voltage at the gate, $V_G$, and at the anode, $V_A$. For convenience, in parts of the text as follows, it is understood that the corresponding hold signal or release signal would accompany the regulating signal according to the mention of the holding step and the releasing step described earlier. All instances of rising and falling of the waveforms in FIG. 10 are in accordance with the shape of a sine wave.

At the beginning, the microcontroller 211 sends a regulating signal for a period 1002 of about 0.125 microseconds. Within the period 1002, the regulating signal begins with a pulsating wave 1003 lasting about 0.06 microseconds, which is a first time period, and pulsating between at 2 Volts and 5 Volts at about 0.02 microseconds intervals. Thereafter, the regulating signal slopes from 2 Volts to 230 Volts for about 0.0625 microseconds, which is a second time period. The pulsating wave 1003 of the period 1002 is responsible for activating the thyristor 431 to allow current flow between the anode (circuit juncture 411) and the gate (circuit juncture 438). It is appreciated that the pulsating wave 1003 may comprise one or more pulses. The pulsating wave 1003 may also be regarded as a spike and need not necessarily be square shaped as shown in FIG. 10. As the current flow between the anode (circuit juncture 411) and the gate (circuit juncture 438) is being established, voltage at the gate (circuit juncture 438), $V_G$, begins to rise from 2 Volts to 230 Volts in the period of 1002 almost synchronously with the voltage at the anode (circuit juncture 411), $V_A$. The voltage at the gate (circuit juncture 434), $V_C$, falls from 230 Volts to −230 Volts during the period 1002. It is believed that $V_C$ is not enhanced during the period 1002.

After the period 1002, the regulating signal undergoes a period 1004 of about 0.375 microseconds, which performs the releasing step, where the thyristor 431 is activated to conduct from the gate (circuit juncture 438) to the cathode (circuit juncture 434). The waveform of the releasing step in period 1004 firstly falls generally from 230 Volts to 0 Volt for about 0.125 microseconds in a third time period but at about midway, about the 0.168 microsecond mark, there is present a fall 1005 lasting about 0.04 microseconds (i.e. a fourth time period). Thereafter, the waveform continues to fall to −230 Volts for about 0.125 microseconds. The effect of period 1004 is that the thyristor 431 releases all the charge accumulated at the gate (circuit juncture 438) during the period 1002 to the cathode (circuit juncture 434). During the period 1004, the voltage at the cathode (circuit juncture 434), $V_C$, is enhanced as it slopes from −230 Volts to 230 Volts. It is believed that the charges released runs out as $V_C$ continues to slope from 0 Volt to 230 Volts.

After the period 1004, the regulating signal undergoes another period 1006 of about 0.25 microseconds, which performs the holding step. The waveform of the holding step in period 1006 firstly rises generally from −230 Volts to 0 Volt in a fifth time period for about 0.125 microseconds but at about midway, about the 0.51 microsecond mark, there is present a rise 1007 lasting about 0.04 microseconds (i.e. a sixth time period). Thereafter, the waveform continues to rise to 230 Volts for about 0.125 microseconds. The effect of period 1006 is that it activates the thyristor 431 to accumulate and hold charge at the gate (circuit juncture 438). $V_C$ drops from 230 Volts to −230 Volts during the duration of period 1006 as no charge is released to the cathode (circuit juncture 434).

After the period 1006, the regulating signal repeats in sequence the releasing step carried out in period 1004 and the holding step carried out in period 1006 continuously to provide the desired voltage enhancement to the cathode (circuit juncture 434).

It is appreciated that the microcontroller(s) discussed herein is/are a controller or controllers for providing control over various processes of the circuits discussed herein. Other controllers similar to microcontrollers such as more rudimentary or sophisticated microprocessors or computers may also be used. It is connected to various components of the circuits, either directly or through Integrated Circuits (i.e. IC1 370 and IC2 380, which can be microcontrollers and the like as well), or through conducting wires running through a Printed Circuit Board. A program written in Programmable Integrated Control (PIC) language (i.e. a type of assembly language) is programmed into the microcontroller(s) to enable the microcontroller(s) or Integrated Circuits to monitor and command various activities taking place at various points within the circuits. The communication between the microcontroller(s) and the components is in the form of electronic waves passing through the conducting wires. The microcontroller(s) being used in the circuits discussed herein may have 40 pins. Each pin or group of pins may monitor or command designated functions at specific points in the circuits. The Integrated Circuits may each have 8 pins. The PIC program could have about 68,356 lines of code and have a minimum response time in the execution of the codes that is measured in microseconds so as to keep up with the steps of the method steps discussed herein.

It is further appreciated that all circuit points mentioned herein refers to a selected current conducting point of interest in a circuit. All circuit junctures mentioned herein refers to a region of interest in a circuit, which includes one or more circuit points. Connection or coupling to a circuit juncture refers to connection to one or more of the circuit points in the circuit juncture. When a circuit juncture inputs or outputs current or signal, it means that one or more of the circuit points in the circuit juncture are involved in inputting or outputting the current or signal.

Many modifications can be made to the apparatus and the method for enhancing power output by those skilled in the art having the understanding of the above described disclosure together with the drawings. Therefore, it is to be understood that the apparatus and the method for enhancing power output is not to be limited to the above description contained herein only.

The invention claimed is:

1. An apparatus for enhancing power output, the apparatus comprising:
    a thyristor having an anode, a cathode and a gate; and
    a controller connected to the gate, the cathode and the anode
    wherein, voltage is provided to the anode, and
    the controller is configured for activating the thyristor to carry out a series of, successive and alternating, holding steps and release steps, the thyristor being activated such that (i) during each one of the holding steps, current flows within the thyristor from the anode to the gate to accumulate and hold charge at the gate, and (ii) during each one of the release steps, current is conducted from the gate to the cathode to release the charge accumulated at the gate in a previous holding step so as to provide the cathode with an enhanced voltage, the enhanced voltage being an enhancement of the voltage at the anode.

2. The apparatus as claimed in claim 1, wherein the controller activates the thyristor through a regulating signal comprising:
    a first time period having a pulsating wave; and
    a second time period in which the regulating signal rises to the voltage at the anode.

3. The apparatus as claimed in claim 2, wherein the regulating signal further comprises:
    a third time period in which the regulating signal drops from the voltage at the anode to a lower voltage value,
    the lower voltage value lasting a fourth time period during the third time period so as to activate the thyristor to conduct the current from the gate to the cathode in the release step.

4. The apparatus as claimed in claim 1, wherein a time difference between the holding steps and the release steps is on an order of microseconds, or shorter to an extent that would still provide the enhanced voltage at the cathode.

5. The apparatus as claimed in claim 1, the apparatus comprising:
    a capacitor arranged at the gate to supplement the voltage at the cathode.

6. The apparatus as claimed in claim 1, the apparatus comprising:
    a Direct Current (DC) source; and
    a switch for switching the switch to lead current from the DC source to the anode when the controller detects that voltage of the DC source is below a threshold value, and for switching the switch to lead current to an output terminal connected to the cathode when the controller detects that voltage of the DC source is above the threshold value.

7. The apparatus as claimed in claim 6, the apparatus comprising:
    one or more capacitors arranged in parallel to the switch, the controller being configured to enable current discharged from the one or more capacitors to flow to the switch if the voltage of the DC source is below the threshold value.

8. The apparatus as claimed in claim 1, the apparatus comprising:
    one or more Insulated Gate Bipolar Transistor (IGBT) controlled by the controller to convert the voltage at the cathode into an Alternating Current (AC) signal,
    wherein the controller is configured for detecting energy loss caused by the one or more IGBT and for adjusting a compensation circuit to compensate the energy loss based on the energy loss detected.

9. The apparatus as claimed in claim 1, the apparatus comprising:
    one or more resistors arranged between the cathode and the anode for adjusting resistance.

10. The apparatus as claimed in claim 9, the controller being configured for monitoring voltage at the anode or the cathode for leading current at the respective anode or cathode to the one or more resistors based on the monitored voltage.

11. The apparatus as claimed in claim 1, the apparatus comprising:
    one or more resistors arranged between the cathode and the anode for adjusting resistance at the cathode; and
    one or more resistors arranged between the anode and the gate for adjusting resistance at the cathode.

12. The apparatus as claimed in claim 11, the controller being configured for monitoring resistance value at the anode, the gate or the cathode for leading current at the respective anode, gate or cathode to the one or more resistors based on the monitored resistance value.

13. The apparatus as claimed in claim 11, the controller being configured for monitoring voltage at the anode of the thyristor for leading current to a diode based on the monitored voltage, the diode comprising a diode anode for receiving current from the anode of the thyristor and a diode cathode connected to the gate of the thyristor.

14. The apparatus as claimed in claim 3, wherein the controller activates the thyristor to allow current at the cathode to increase by 1% through the regulating signal prior to an increase of voltage at the cathode to the enhanced voltage.

15. The apparatus as claimed in claim 1, the apparatus comprising:
    a second thyristor comprising:
    a second anode for receiving the enhanced voltage;
    a second gate for connecting to a load; and
    a second cathode for connecting to the load.

16. The apparatus as claimed in claim 1, wherein the controller activates the thyristor to allow the current flow from the anode to the gate in the holding step until a resistance value calculated at the anode is similar to a resistance value calculated at the gate for a first time period.

17. The apparatus as claimed in claim 16, wherein the controller activates the thyristor to allow the current flow from the gate to the cathode in the release step until a resistance value calculated at the anode is similar to a resistance value calculated at the cathode for a second time period.

18. The apparatus as claimed in claim 17, wherein the second time period is longer than the first time period.

19. The apparatus as claimed in claim 1, wherein the controller activates the thyristor to allow the current flow from the anode to the gate in the holding step until voltage at the anode is similar to voltage at the gate for a first time period.

20. The apparatus as claimed in claim 19, wherein the controller activates the thyristor to allow the current flow from the gate to the cathode in the release step until voltage at the anode is similar to voltage at the cathode for a second time period.

21. The apparatus as claimed in claim 20, wherein the second time period is longer than the first time period.

22. The apparatus as claimed in claim 3, the regulating signal comprising:
a fifth time period having a voltage of the regulating signal rising from a negative peak voltage to zero voltage; and
a rise in voltage lasting a sixth time period during the fifth time period so as to activate the thyristor to allow the current flow from the anode to the gate in the holding step.

23. A method for enhancing power output of an apparatus which includes a thyristor having an anode, a cathode and a gate, the anode being provided with a voltage, the method comprising:
carrying out a series of successive and alternating holding steps and release steps such that during each one of the holding steps, current is conducted within the thyristor from the anode to the gate to accumulate and hold charge at the gate and such that during each one of the release steps, current is conducted from the gate to the cathode to release the charge accumulated at the gate in a previous holding step so as to provide the cathode with an enhanced voltage, the enhanced voltage being an enhancement of the voltage at the anode.

24. The method as claimed in claim 23, the method comprising:
activating the thyristor through a regulating signal, which includes:
a first time period having a pulsating wave; and a second time period in which the regulating signal rises to the voltage at the anode.

25. The method as claimed in claim 24, wherein the regulating signal further comprises: a third time period in which the regulating signal drops from the voltage at the anode to a lower voltage value, the lower voltage value lasting a fourth time period during the third time period so as to activate the thyristor to conduct current from the gate to the cathode in the release step.

26. The method as claimed in claim 23, wherein a time difference between the each of the holding steps and each of the release steps is on an order of microseconds, or shorter to an extent that would still provide the enhanced voltage at the cathode.

27. The method as claimed in claim 23, the method comprising:
supplementing voltage at the cathode with current discharged from a capacitor arranged at the gate.

28. The method as claimed in claim 23, the method comprising:
switching a switch to lead current from a DC source to the anode when the controller detects that voltage of the DC source is below a threshold value; and
switching a switch to lead current to an output terminal connected to the cathode when the controller detects that voltage of the DC source is above the threshold value.

29. The method as claimed in claim 28, the method comprising:
enabling current discharged from one or more capacitors arranged in parallel to the switch to flow to the switch if the voltage of the DC source is below the threshold value.

30. The method as claimed in claim 23, the method comprising:
converting voltage at the cathode into an Alternating Current (AC) signal using one or more Insulated Gate Bipolar Transistor (IGBT) controlled by the controller;
detecting energy loss caused by the one or more IGBT; and
adjusting a compensation circuit to compensate the energy loss based on the energy loss detected.

31. The method as claimed in claim 23, the method comprising:
adjusting resistance using one or more resistors arranged between the cathode and the anode.

32. The method as claimed in claim 31, the method comprising:
leading current at the anode or the cathode to the one or more resistors based on voltage monitored voltage at the respective anode or cathode.

33. The method as claimed in claim 23, the method comprising:
adjusting resistance using one or more resistors arranged between the cathode and the anode and one or more resistors between the anode and the gate.

34. The method as claimed in claim 33, the method comprising:
leading current at the anode, the gate or the cathode to the one or more resistors based on monitored resistance value at the respective anode, gate or cathode.

35. The method as claimed in claim 33, the method comprising:
monitoring voltage at the anode of the thyristor for leading current to a diode based on the monitored voltage, the diode comprising a diode anode for receiving current from the anode of the thyristor and a diode cathode connected to the gate of the thyristor.

36. The method as claimed in claim 25, the method comprising:
activating the thyristor to allow current at the cathode to increase by 1% through the regulating signal prior to an increase of voltage at the cathode to the enhanced voltage.

37. The method as claimed in claim 23, the method comprising:
leading current to an anode of a second thyristor from the cathode of the thyristor to apply the enhanced voltage to the anode of the second thyristor, a gate and a cathode of the second thyristor being connected to a load.

38. The method as claimed in claim 23, the method comprising:
activating the thyristor to allow the current flow from the anode to the gate in the holding step until a resistance value calculated at the anode is similar to a resistance value calculated at the gate for a first time period.

39. The method as claimed in claim 38, the method comprising:
activating the thyristor to allow current flow from the anode to the cathode in the release step until a resistance value calculated at the anode is similar to a resistance value calculated at the cathode for a second time period.

40. The method as claimed in claim 39, wherein the second period is longer than the first period.

41. The method as claimed in claim 23, the method comprising:
activating the thyristor to allow the current flow from the anode to the gate in the holding step until voltage at the anode is similar to voltage at the gate for a first time period.

42. The method as claimed in claim 41, the method comprising:
   activating the thyristor to allow the current flow from the anode to the cathode in the release step until a voltage at the anode is similar to a voltage at the cathode for a second time period.

43. The method as claimed in claim 42, wherein the second period is longer than the first period.

44. The method as claimed in claim 25, the regulating signal comprising:
   a fifth time period having a voltage of the regulating signal rising from a negative peak voltage to zero voltage; and
   a rise in voltage lasting a sixth time period during the fifth time period so as to activate the thyristor to allow the current flow from the anode to the gate in the holding step.

* * * * *